US012100936B2

(12) United States Patent
Takizawa

(10) Patent No.: US 12,100,936 B2
(45) Date of Patent: Sep. 24, 2024

(54) NITRIDE SEMICONDUCTOR STRUCTURE, NITRIDE SEMICONDUCTOR DEVICE, AND METHOD FOR FABRICATING THE DEVICE

(71) Applicant: Panasonic Intellectual Property Management Co., Ltd., Osaka (JP)

(72) Inventor: Toshiyuki Takizawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 352 days.

(21) Appl. No.: 17/767,293

(22) PCT Filed: Oct. 8, 2020

(86) PCT No.: PCT/JP2020/038155
§ 371 (c)(1),
(2) Date: Apr. 7, 2022

(87) PCT Pub. No.: WO2021/070910
PCT Pub. Date: Apr. 15, 2021

(65) Prior Publication Data
US 2022/0367748 A1 Nov. 17, 2022

(30) Foreign Application Priority Data
Oct. 9, 2019 (JP) .................................. 2019-186371

(51) Int. Cl.
*H01L 33/00* (2010.01)
*H01L 21/02* (2006.01)
(Continued)

(52) U.S. Cl.
CPC ........ *H01S 5/327* (2013.01); *H01L 21/02381* (2013.01); *H01L 21/02389* (2013.01);
(Continued)

(58) Field of Classification Search
CPC ......... H01L 21/02433; H01L 21/02516; H01L 21/02609; H01L 33/002; H01L 33/005; H01L 33/18; H01L 29/045
See application file for complete search history.

(56) References Cited

U.S. PATENT DOCUMENTS 8,679,650 B2 * 3/2014 Itagaki .................. C30B 23/025
204/192.15
2005/0258451 A1 11/2005 Saxler et al.
(Continued)

FOREIGN PATENT DOCUMENTS

EP 0 996 173 A2 4/2000
JP 2000-133841 A 5/2000
(Continued)

OTHER PUBLICATIONS

Takao Misaki et al., "Epitaxial growth and characterization of ZnGeN2 by metalorganic vapor phase epitaxy", Journal of Crystal Growth, 2004, vol. 260, pp. 125-129.
(Continued)

*Primary Examiner* — David Vu
*Assistant Examiner* — Brandon C Fox
(74) *Attorney, Agent, or Firm* — Rimon P.C.

(57) ABSTRACT

A nitride semiconductor structure includes a Group III nitride semiconductor portion and a Group II-IV nitride semiconductor portion. The Group III nitride semiconductor portion is single crystalline. The Group III nitride semiconductor portion has a predetermined crystallographic plane. The Group II-IV nitride semiconductor portion is provided on the predetermined crystallographic plane of the Group III nitride semiconductor portion. The Group II-IV nitride semiconductor portion is single crystalline. The Group II-IV nitride semiconductor portion contains a Group II element and a Group IV element. The Group II-IV nitride semiconductor portion forms a heterojunction with the Group III (Continued)

nitride semiconductor portion. The predetermined crystallographic plane is a crystallographic plane other than a (0001) plane.

16 Claims, 23 Drawing Sheets

(51) Int. Cl.
  *H01L 33/18* (2010.01)
  *H01S 5/327* (2006.01)
(52) U.S. Cl.
  CPC .... *H01L 21/0243* (2013.01); *H01L 21/02433* (2013.01); *H01L 21/02458* (2013.01); *H01L 21/02494* (2013.01); *H01L 21/02516* (2013.01); *H01L 21/02521* (2013.01); *H01L 21/02576* (2013.01); *H01L 21/02579* (2013.01); *H01L 21/02609* (2013.01); *H01L 21/0262* (2013.01); *H01L 21/02639* (2013.01); *H01L 21/02647* (2013.01); *H01L 21/0265* (2013.01); *H01L 33/002* (2013.01); *H01L 33/005* (2013.01); *H01L 33/18* (2013.01); *H01L 21/02488* (2013.01); *H01L 21/02502* (2013.01)

(56) References Cited

U.S. PATENT DOCUMENTS

| 2006/0017064 A1 | 1/2006 | Saxler et al. |
| 2007/0145397 A1 | 6/2007 | DenBaars et al. |
| 2007/0269965 A1 | 11/2007 | Gil et al. |
| 2013/0240026 A1 | 9/2013 | Atwater et al. |

FOREIGN PATENT DOCUMENTS

| JP | 2007-538402 A | 12/2007 |
| JP | 2008-507853 A | 3/2008 |
| JP | 2008-513327 A | 5/2008 |
| JP | 2009-518874 A | 5/2009 |

OTHER PUBLICATIONS

Duc Duy Le et al., "Growth of single crystal non-polar (1120) ZnSnN2 films on sapphire substrate", Applied Surface Science, Mar. 19, 2019, vol. 481, pp. 819-824.

International Search Report dated Jan. 12, 2021 issued in International Patent Application No. PCT/JP2020/038155, with English translation.

* cited by examiner

ZnGeN₂ (001) plane

500nm

ZnGeN₂ poly-crystal

3 μm

NITRIDE SEMICONDUCTOR STRUCTURE, NITRIDE SEMICONDUCTOR DEVICE, AND METHOD FOR FABRICATING THE DEVICE

CROSS-REFERENCE OF RELATED APPLICATIONS

This application is the U.S. National Phase under 35 U.S.C. § 371 of International Patent Application No. PCT/JP2020/038155, filed on Oct. 8, 2020, which in turn claims the benefit of Japanese Patent Application No. 2019-186371, filed on Oct. 9, 2019, the entire disclosures of which Applications are incorporated by reference herein.

TECHNICAL FIELD

The present disclosure generally relates to a nitride semiconductor structure, a nitride semiconductor device, and a method for fabricating the nitride semiconductor device. More particularly, the present disclosure relates to a nitride semiconductor structure including a Group III nitride semiconductor portion and a Group II-IV nitride semiconductor portion, a nitride semiconductor device including such a nitride semiconductor structure, and a method for fabricating the nitride semiconductor device.

BACKGROUND ART

Patent Literature 1 teaches forming, in a light-emitting diode as a light-emitting device that uses a semiconductor layered structure, a $ZnGeN_2$ active layer between two layers of a Group III nitride such as GaN.

In the semiconductor layered structure of Patent Literature 1, however, a Group III nitride layer is formed as a polycrystalline layer on a substrate. Patent Literature 1 teaches neither epitaxially growing a Group II-IV nitride semiconductor portion over a single-crystalline Group III nitride semiconductor portion nor any problem to be caused when the Group II-IV nitride semiconductor portion is epitaxially grown thereon.

CITATION LIST

Patent Literature

Patent Literature 1: JP 2000-133841 A

SUMMARY OF INVENTION

An object of the present disclosure is to provide a nitride semiconductor structure, a nitride semiconductor device, and a method for fabricating the nitride semiconductor device, all of which are configured or designed to achieve a configuration in which a single-crystalline Group II-IV nitride semiconductor portion is formed over a single-crystalline Group III nitride semiconductor portion.

A nitride semiconductor structure according to an aspect of the present disclosure includes a Group III nitride semiconductor portion and a Group II-IV nitride semiconductor portion. The Group III nitride semiconductor portion is single crystalline. The Group III nitride semiconductor portion contains a Group III element, where the Group III element is an element selected from the group 13 elements of the periodic table. The Group III nitride semiconductor portion has a predetermined crystallographic plane. The Group II-IV nitride semiconductor portion is provided on the predetermined crystallographic plane of the Group III nitride semiconductor portion. The Group II-IV nitride semiconductor portion is single crystalline. The Group II-IV nitride semiconductor portion contains a Group II element and a Group IV element, where the Group II element is an element selected from either the group 2 elements of the periodic table or the group 12 elements of the periodic table and the Group IV element is an element selected from the group 14 elements of the periodic table. The Group II-IV nitride semiconductor portion forms a heterojunction with the Group III nitride semiconductor portion. The predetermined crystallographic plane is a crystallographic plane other than a (0001) plane.

A nitride semiconductor device according to another aspect of the present disclosure includes a semiconductor element that includes at least a part of the Group II-IV nitride semiconductor portion of the nitride semiconductor structure described above.

A method for fabricating the nitride semiconductor device according to still another aspect of the present disclosure includes epitaxially growing, on a predetermined crystallographic plane other than a (0001) plane of a single-crystalline Group III nitride semiconductor portion containing a Group III element, a single-crystalline Group II-IV nitride semiconductor portion containing a Group II element and a Group IV element, where the Group III element is an element selected from the group 13 elements of the periodic table, the Group II element is an element selected from either the group 2 elements of the periodic table or the group 12 elements of the periodic table, and the Group IV element is an element selected from the group 14 elements of the periodic table.

DESCRIPTION OF EMBODIMENTS

FIG. 1 and FIGS. 4-23C to be referred to in the following description of embodiments and their variations are all schematic representations. That is to say, the ratio of the dimensions (including thicknesses) of respective constituent elements illustrated on the drawings does not always reflect their actual dimensional ratio.

First Embodiment (1) Overview

Figure 1:
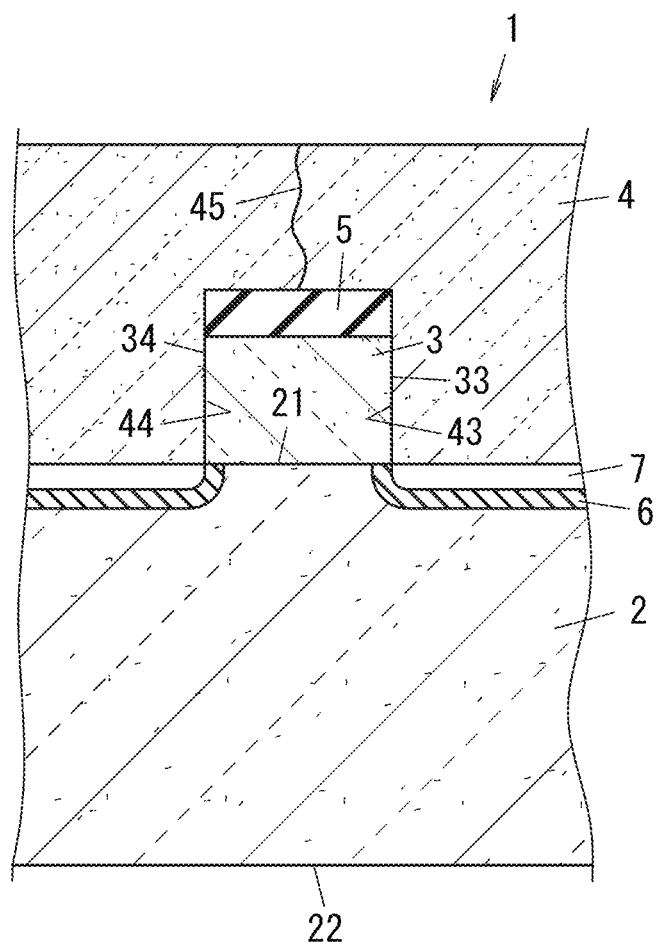
FIG. 1 is a cross-sectional view of a nitride semiconductor structure according to a first embodiment.

A nitride semiconductor structure 1 according to a first embodiment will be described with reference to FIG. 1.

The nitride semiconductor structure 1 includes a Group III nitride semiconductor portion 3 and a Group II-IV nitride semiconductor portion 4.

The Group III nitride semiconductor portion 3 is single crystalline. The Group III nitride semiconductor portion 3 contains a Group III element. In this case, the Group III element is an element selected from the group 13 elements of the periodic table. Specifically, the Group III element is an element selected from the group consisting of boron (B), aluminum (Al), gallium (Ga), indium (In), thallium (Tl), and nihonium (Nh). The Group III nitride semiconductor contained in the Group III nitride semiconductor portion 3 is expressed by the general formula $A_{III}N$, where $A_{III}$ is a Group III element.

The Group II-IV nitride semiconductor portion 4 is also single crystalline. The Group II-IV nitride semiconductor portion 4 contains a Group II element and a Group IV element. In this case, the Group II element is an element selected from either the group 2 elements of the periodic table or the group 12 elements of the periodic table. Specifically, the Group II element is an element selected from the group consisting of beryllium (Be), magnesium (Mg), calcium (Ca), strontium (Sr), barium (Ba), radium (Ra), zinc (Zn), cadmium (Cd), mercury (Hg), and copernicium (Cn). The Group IV element is an element selected from the group 14 elements of the periodic table. Specifically, the Group IV element is an element selected from the group consisting of carbon (C), silicon (Si), germanium (Ge), tin (Sn), lead (Pb), and flerovium (Fl). The Group II-IV nitride semiconductor contained in the Group II-IV nitride semiconductor portion 4 is expressed by the general formula $B_{II}C_{IV}N_2$, where $B_{II}$ is a Group II element and $C_{IV}$ is a Group IV element.

The Group III nitride semiconductor portion 3 has a predetermined crystallographic plane. The Group II-IV nitride semiconductor portion 4 is provided on the predetermined crystallographic plane of the Group III nitride semiconductor portion 3. In this case, the Group II-IV nitride semiconductor portion 4 forms a heterojunction with the Group III nitride semiconductor portion 3.

(2) Research on Plane Orientation of Predetermined Crystallographic Plane

The present inventors carried out research on the plane orientation of the predetermined crystallographic plane in a situation where either an AlN crystal or a GaN crystal was adopted as the Group III nitride semiconductor contained in the Group III nitride semiconductor portion 3 and a $ZnGeN_2$ crystal was adopted as the Group II-IV nitride semiconductor contained in the Group II-IV nitride semiconductor portion 4. The following are the details of the research.

(2.1) Crystal Growth of Group II-IV Nitride Semiconductor on C-Plane of Group III Nitride Semiconductor The present inventors discovered a problem that when a Group II-IV nitride semiconductor (such as a $ZnGeN_2$ crystal) was hetero-epitaxially grown on a Group III nitride semiconductor (such as a GaN crystal or an AlN crystal), too many rotary domains were sometimes jumbled up in a confined region. This problem was encountered by the present inventors by carrying out research and development for growing a $ZnGeN_2$ crystal on an AlN crystal by metalorganic chemical vapor deposition (MOCVD) process and thereby evaluating the crystallinity, surface morphology, cross-sectional structure, and other properties of the $ZnGeN_2$ crystal. Note that such a problem is neither mentioned nor suggested by Patent Literature 1.

The present inventors carried out an experiment of growing a $ZnGeN_2$ crystal on a c-plane of an AlN crystal. The results of the experiment are as follows:

First, a single-crystalline silicon substrate, having a first principal surface and a second principal surface opposite from the first principal surface, was used to prepare a sample in which an AlN crystal was grown to a thickness of 246 nm on the first principal surface of the single-crystalline silicon substrate by MOCVD process. In this case, the first principal surface of the single-crystalline silicon substrate was a (111) plane. The principal surface of the AlN crystal thus grown (i.e., the opposite surface, facing away from the single-crystalline silicon substrate, of the AlN crystal) was a c-plane. The c-plane of the AlN crystal is a (0001) plane.

A $ZnGeN_2$ crystal was grown by MOCVD process on the principal surface of the AlN crystal of this sample. In this manner, a sample having a multilayer structure of $ZnGeN_2$ crystal/AlN crystal/Si substrate was prepared. When the $ZnGeN_2$ crystal was grown by MOCVD process, diethyl zinc ($Zn(C_2H_5)_2$), tetraethyl germanium ($Ge(C_2H_5)_4$), and ammonia ($NH_3$) were used as source materials (also called "precursors") for Zn, Ge, and N, respectively. Alternatively, dimethyl zinc ($Zn(CH_3)_2$) and tetramethyl germanium ($Ge(CH_3)_4$), for example, may also be used as source materials for Zn and Ge, respectively. This reduces the carbon content of the source materials, thus enabling reducing, even if the crystal growing temperature of the ZnGeN$_2$ crystal is set at a temperature sufficiently higher than the decomposition temperature of the source materials or if the decomposition efficiency of the source materials is increased, the precipitation of carbon in the ZnGeN$_2$ crystal.

The condition for growing the ZnGeN$_2$ crystal by MOCVD process included a substrate temperature (hereinafter also referred to as a "crystal growing temperature") of 900° C., a growth pressure of 70 kPa, and a growth time of four hours. As used herein, the "substrate temperature" may be replaced with the temperature of a susceptor supporting a wafer to be diced into the single-crystalline silicon substrates. For example, the substrate temperature may be replaced with the temperature, measured with a thermocouple, of the susceptor. As used herein, the "growth pressure" refers herein to the pressure in a reactor in a state where the respective source materials and carrier gases are being supplied into the reactor of an MOCVD system. The present inventors successfully obtained a ZnGeN$_2$ thin film having a thickness of approximately 0.4 μm and a mirror surface. As far as the present inventor know, this experiment should be the world's first successful growth of the ZnGeN$_2$ crystal by MOCVD process.

Figure 2:
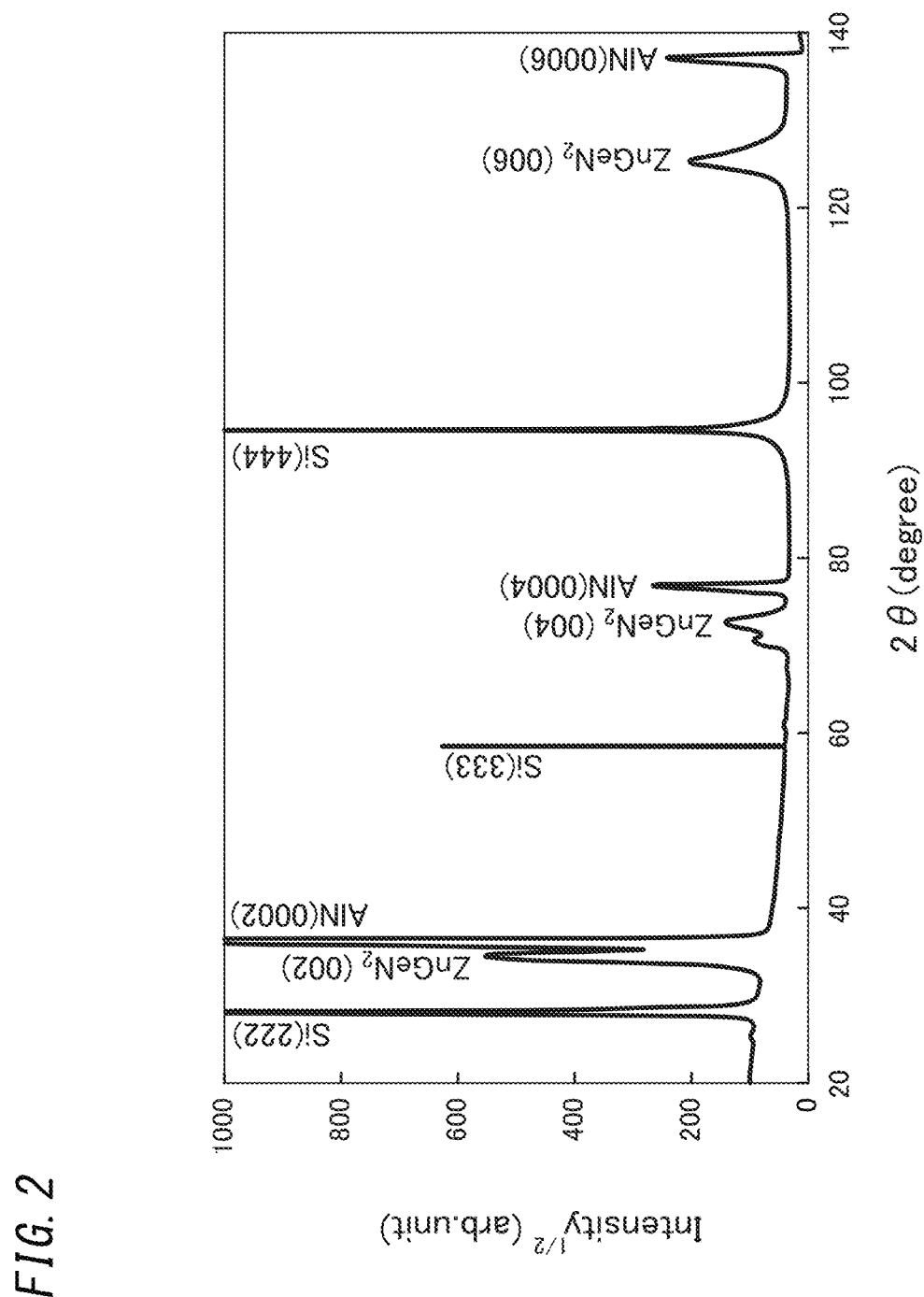
FIG. 2 shows the results of an X-ray rocking curve analysis that was carried out by ω scan of X-ray diffraction on a sample having a multilayer structure of $ZnGeN_2$ crystal/AlN crystal/single-crystalline silicon substrate.

FIG. 2 shows the results of an X-ray rocking curve (XRC) analysis that was carried out by ω scan (2θ-ω scan) of X-ray diffraction on a sample having the multilayer structure of ZnGeN$_2$ crystal/AlN crystal/single-crystalline silicon substrate. It can be seen that in FIG. 2, there are not only a plurality of peaks indicating the presence of Si but also a plurality of peaks indicating the presence of ZnGeN$_2$ and a plurality of peaks indicating the presence of AlN as well. In FIG. 2, each peak is accompanied with the name of the crystal corresponding to that peak and its plane orientation. As can be seen from FIG. 2, the ZnGeN$_2$ crystal has c-axis orientation. That is to say, FIG. 2 indicates that a ZnGeN$_2$ crystal, of which a principal surface was a c-plane, was epitaxially grown on the principal surface of an AlN crystal, of which a principal surface was a c-plane.

Figure 3A:
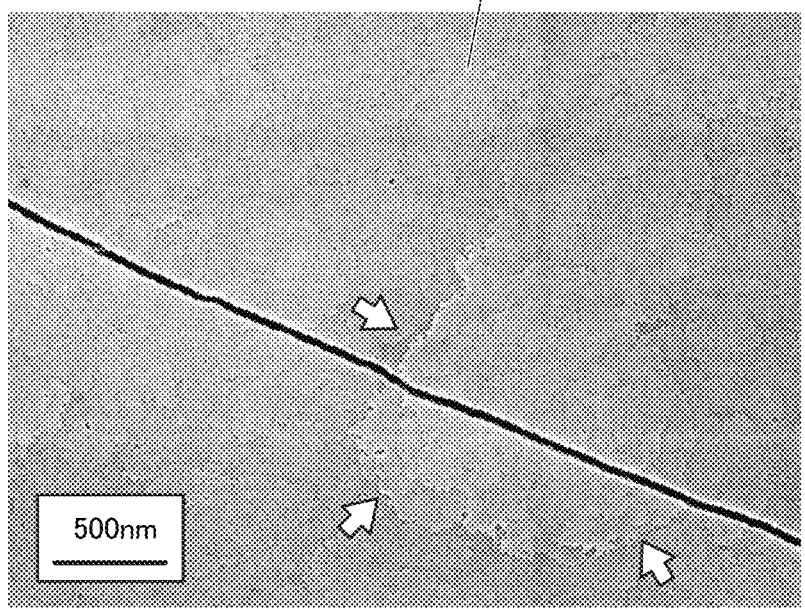
FIG. 3A shows a surface SEM image of the sample having the multilayer structure of $ZnGeN_2$ crystal/AlN crystal/single-crystalline silicon substrate.
Figure 3B:
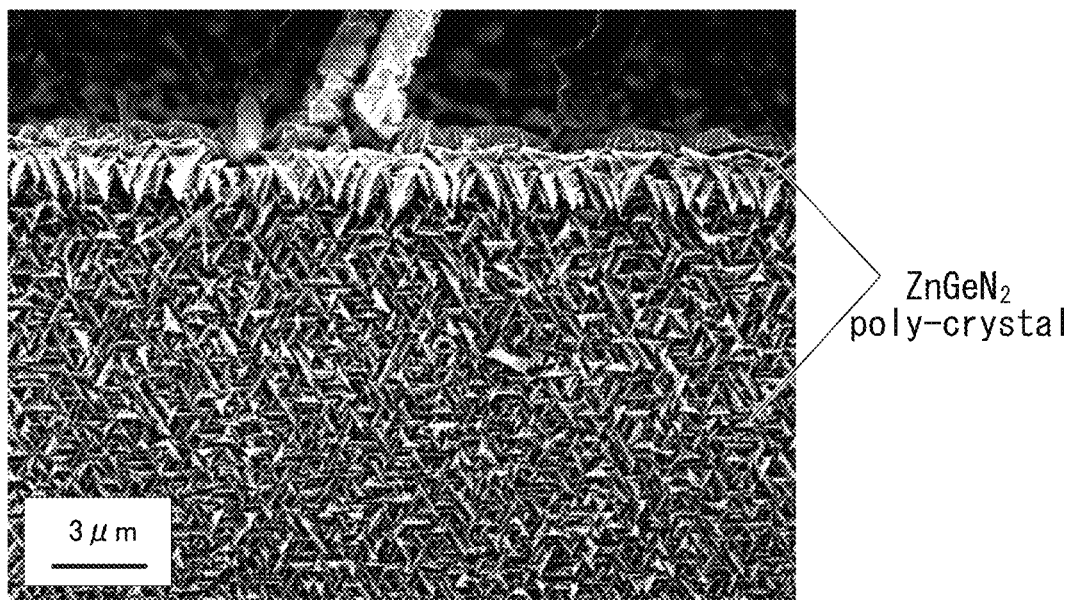
FIG. 3B shows an SEM image in the vicinity of an AlN cleaved face of the sample having the multilayer structure of $ZnGeN_2$ crystal/AlN crystal/single-crystalline silicon substrate.

The present inventors observed the ZnGeN$_2$ crystal of the above-described sample through a scanning electron microscope (SEM). The results of the observation will be described next with reference to FIGS. 3A and 3B. FIG. 3A is an SEM image obtained by observing the surface (principal surface) of the ZnGeN$_2$ crystal of the sample. FIG. 3B is an SEM image of the ZnGeN$_2$ crystal in the vicinity of an m-plane that is a cleaved face of the AlN crystal. The m-plane of the AlN crystal is a (1-100) plane. As used herein, the negative sign "−" added to a Miller index indicates the inversion of the index following the negative sign. Note that the crack seen around the center of the surface shown in FIG. 3A would be a crack produced due to a difference in coefficient of thermal expansion between Si and AlN and between AlN and ZnGeN$_2$ and is not directly related to the present discussion. Rather, the presence of the crack indicates that the ZnGeN$_2$ crystal was epitaxially grown over the AlN crystal.

Note that FIG. 3A is an SEM image obtained by observing a surface region, slightly more whitened than the mirror surface, of the ZnGeN$_2$ crystal to highlight a variation in surface morphology due to the crystal structure of the ZnGeN$_2$ crystal. As indicated by the arrows in FIG. 3A, the traces of swollen plane growth are recognizable on the principal surface of the ZnGeN$_2$ crystal. The ZnGeN$_2$ crystal is a crystal having dyad or two-fold rotational symmetry as will be described later. Thus, if the surface of the ZnGeN$_2$ crystal were not a mirror surface but a somewhat roughened surface, then a striped pattern should be recognized. Actually, however, no such patterns were observed there.

On the other hand, referring to FIG. 3B, it can be seen that the ZnGeN$_2$ crystal has grown to draw V-lines from a cleaved face of the AlN crystal. A striped pattern with six-fold symmetry is recognizable on the surface of the ZnGeN$_2$ crystal in the vicinity of the cleaved face. The orientation of this striped pattern agrees with the crystal axis direction [11-20] of the AlN crystal. It is presumed from its crystal structure that the ZnGeN$_2$ crystal would assume such a striped morphology, although it depends on its crystal growing condition. Contrary to such presumption, in FIG. 3A, the surface of the ZnGeN$_2$ crystal does not have such a striped pattern. Thus, it is presumed that the irregular morphology such as the one shown in FIG. 3B would have been produced as a result of competition with bonding of those many rotary domains that were jumbled up in a confined region.

These results reveal that those many rotary domains were jumbled up on the c-plane of the AlN crystal, i.e., a ZnGeN$_2$ crystal having a plurality of domains was grown on the c-plane of the AlN crystal.

(2.2) Mechanism by Which Rotary Domains are Produced in Group II-IV Nitride Semiconductor First, it will be described how such a problem of having too many rotary domains jumbled up in a confined region arises in a Group II-IV nitride semiconductor crystal that has grown on a Group III nitride semiconductor.

Figure 4:
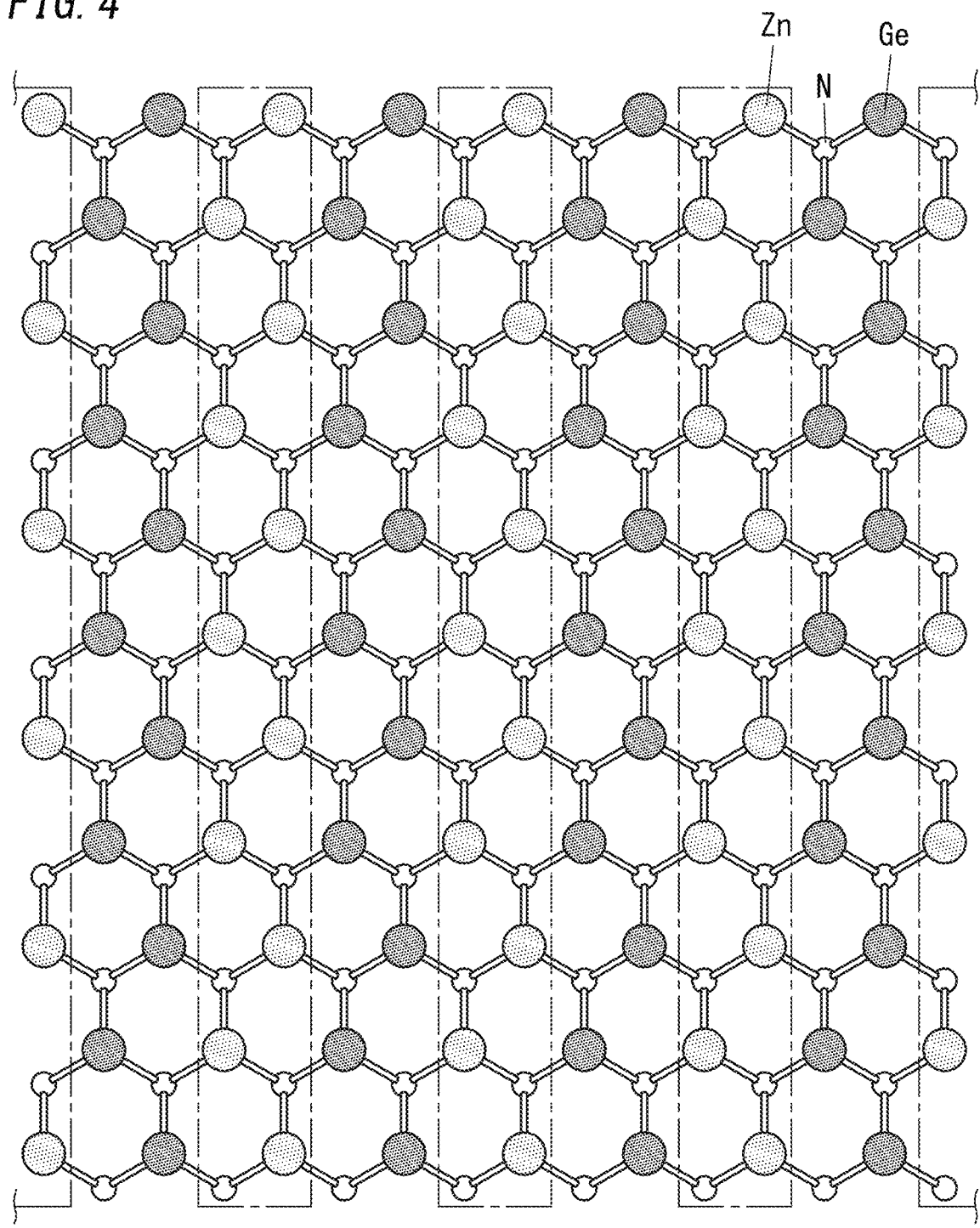
FIG. 4 is a schematic representation of a crystal structure of single-crystalline $ZnGeN_2$ as viewed from a c-plane.
Figure 5:
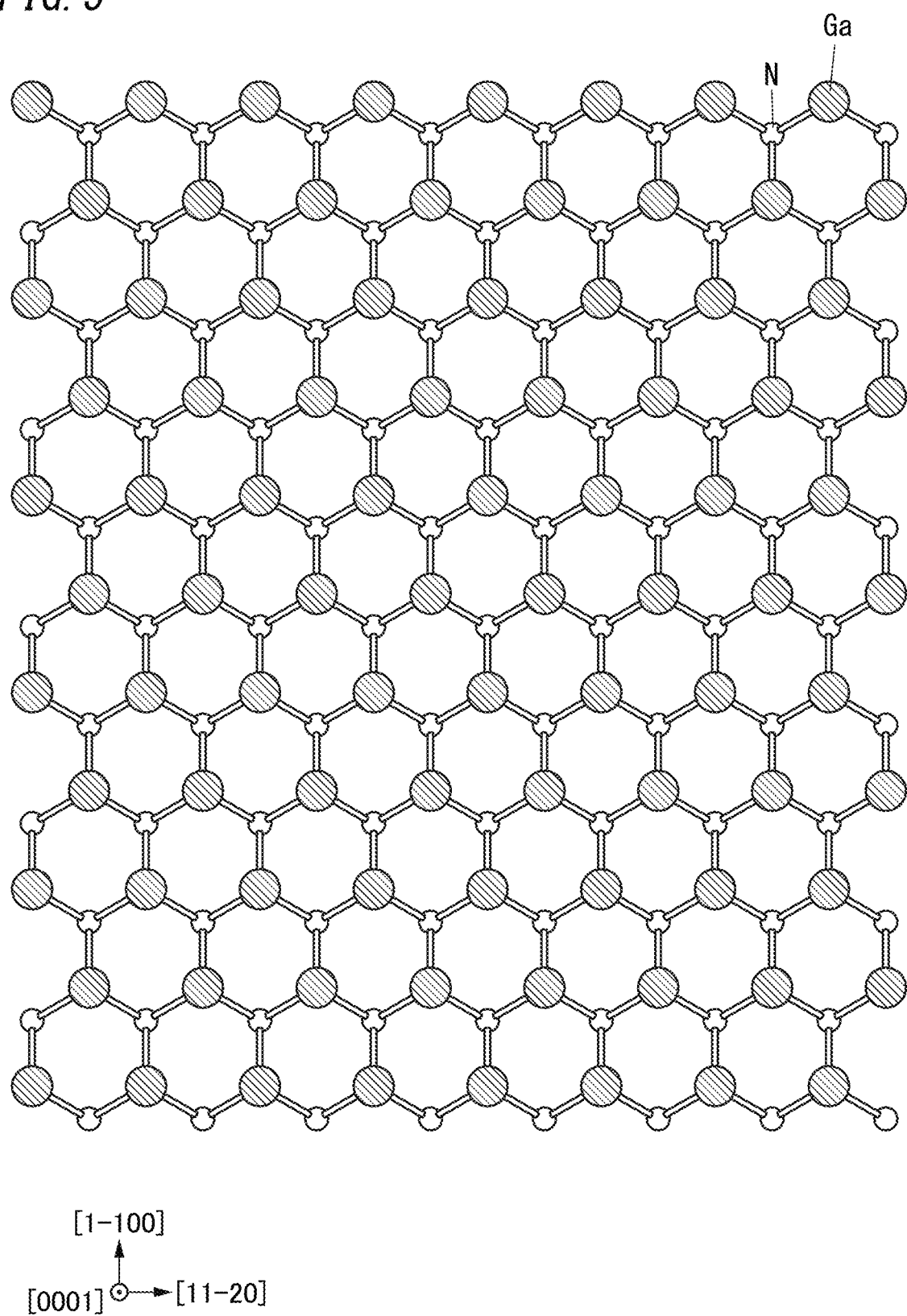
FIG. 5 is a schematic representation of a crystal structure of single-crystalline GaN as viewed from a c-plane.

FIG. 4 is a schematic representation of a crystal structure of a ZnGeN$_2$ crystal. More specifically, FIG. 4 is a schematic representation illustrating the crystal structure of the ZnGeN$_2$ crystal as viewed from the crystal axis [001] direction indicating the c-axis of the ZnGeN$_2$ crystal. FIG. 5 is a schematic representation of a crystal structure of a GaN crystal. More specifically, FIG. 5 is a schematic representation illustrating the crystal structure of the GaN crystal as viewed from the crystal axis [0001] direction indicating the c-axis of the GaN crystal. Note that although a ZnGeN$_2$ crystal and a GaN crystal are cited as examples, the generality of logic of the following discussion is not affected even if another Group II-IV nitride semiconductor and another Group III nitride semiconductor are used as their replacements.

In FIG. 4, the small spheres represent N atoms. Also, in FIG. 4, the spheres with denser hatching represent Ge atoms, while the spheres with less dense hatching represent Zn atoms. Note that in FIG. 4, those atoms are hatched in dots not to indicate a cross section thereof but just to make the Ge and Zn atoms easily distinguishable from each other on the drawing.

In FIG. 5, the small spheres represent N atoms. Also, in FIG. 5, the spheres with hatching represent Ga atoms. Note that in FIG. 5, those atoms are hatched not to indicate a cross section thereof but just to make the N and Ga atoms easily distinguishable from each other on the drawing.

At the lower left corner in each of FIGS. 4 and 5, the crystal axis directions are indicated by arrows and Miller indices. More specifically, at the lower left corner of FIG. 4, the crystal axis directions [001], [100], and [010] indicating the c-axes of a ZnGeN$_2$ crystal are shown. At the lower left corner of FIG. 5, a crystal axis direction [0001] indicating a c-axis of a GaN crystal, a crystal axis direction [1-100] indicating an m-axis thereof, and a crystal axis direction [11-20] indicating an a-axis thereof are shown. As used herein, the negative sign "−" added to a Miller index indicates the inversion of the index following the negative sign.

Comparing FIGS. 4 and 5 with each other, it can be seen that the N atoms are located at the same sites. In addition, it can also be seen that in the crystal structure of the GaN crystal shown in FIG. 5, the Ga atoms occupy all sites but the N atom sites. Thus, the GaN crystal has six-fold rotational symmetry, of which the center axis of rotation is defined by the c-axis of the GaN crystal. On the other hand, in the crystal structure of the $ZnGeN_2$ crystal shown in FIG. 4, stripes of Zn atoms and stripes of Ge atoms extend vertically to alternate with each other laterally. This allows the $ZnGeN_2$ crystal to have only two-fold rotational symmetry, of which the center axis of rotation is defined by the c-axis of the $ZnGeN_2$ crystal. In a Group II-IV nitride semiconductor, two types of cations (e.g., Zn atoms and Ge atoms in this example) are arranged orderly as shown in FIG. 4 due to a difference in ionicity between two types of electrically positive cations. As used herein, the phrase "orderly arranged" means that Zn atoms are arranged at Zn sites, Ge atoms are arranged at Ge sites, and the Zn atoms and Ge atoms are arranged regularly and periodically. In a $ZnGeN_2$ crystal, if Zn and Ge atoms change their positions with each other (i.e., if a Zn atom is placed at a Ge site and a Ge atom is placed at a Zn site), then intense alloy scattering will make the respective band edges of the conduction and valence bands of the $ZnGeN_2$ crystal less sharp to cause a decrease in the bandgap. In the $ZnGeN_2$ crystal, if the Zn and Ge atoms are arranged at random, then the bandgap of $ZnGeN_2$, which is expected to be a wide bandgap semiconductor, will decrease from 3.5 eV to about 2 eV.

Suppose a situation where a $ZnGeN_2$ single crystal, in which Zn atoms are located at Zn sites and Ge atoms are located at Ge sites, has been prepared and $ZnGeN_2$ has grown homo-epitaxially on the $ZnGeN_2$ single crystal. In such a situation, in the $ZnGeN_2$ crystal that has grown homo-epitaxially (hereinafter referred to as a "$ZnGeN_2$ homo-epitaxial layer"), Zn atoms are also located at Zn sites and Ge atoms are also located at Ge sites. This allows the $ZnGeN_2$ homo-epitaxial layer to exhibit excellent physical properties. On the other hand, if a $ZnGeN_2$ crystal is grown on a c-plane of a GaN crystal, then a degree of freedom will be allowed every 120 degrees in determination of a cation site of the $ZnGeN_2$ crystal, because the GaN crystal and the $ZnGeN_2$ crystal have mutually different degrees of rotational symmetry around the c-axis as their center axis of rotation.

In this case, the space group of the GaN crystal is $P6_3mc$, while the space group of the $ZnGeN_2$ crystal is $Pna2_1$. Thus, the GaN crystal has six-fold rotational symmetry and the $ZnGeN_2$ crystal has two-fold rotational symmetry as described above. Therefore, if a $ZnGeN_2$ crystal is going to be grown on a c-plane of a GaN crystal, then their atomic arrangements will agree with each other every 120 degrees. Supposing that in-plane crystal axes of $ZnGeN_2$ are determined at random during an initial stage of the crystal growth of the $ZnGeN_2$ crystal, then the problem of having too many rotary domains jumbled up in a confined region will arise to cause Zn and Ge atoms to be arranged at random in a region where domains are combined with each other.

As for how the in-plane orientation of the $ZnGeN_2$ crystal is determined on the GaN crystal, it depends on the surface structure, state, growth condition, and other parameters of the GaN crystal, and therefore, it is impossible to microscopically control the in-plane orientation of the $ZnGeN_2$ crystal on the GaN crystal. That is to say, the in-plane orientation of the $ZnGeN_2$ crystal is determined at random from one place to another. If two adjacent domains (regions) have grown with mutually different in-plane orientations, then Zn atoms and Ge atoms will be randomly arranged in a region where the two adjacent domains with mutually different in-plane orientations are combined with each other. That is to say, in the $ZnGeN_2$ crystal that has grown on a c-plane of the GaN crystal, its bandgap decreases to about 2 eV in the combined region. This would cause inconvenience in the stabilized operation of an electronic device that uses $ZnGeN_2$ with such a combined region. That is why when such a structure having a Group II-IV nitride semiconductor crystal grown on a Group III nitride semiconductor is applied to an electronic device, it should be indispensable to control the respective sites where a Group II element and a Group IV element are arranged in the Group II-IV nitride semiconductor.

(2.3) Design of $ZnGeN_2$/AlN Interface by Computational Science

To control the respective sites where a Group II element and a Group IV element are arranged in a Group II-IV nitride semiconductor, a plane with a low degree of symmetry needs to be used in a Group III nitride semiconductor and the plane orientation of the Group II-IV nitride semiconductor to be grown from that plane needs to be uniquely determined by interfacial energy. The interfacial structure is so difficult to analyze that the interface is herein designed by computational science.

The plane orientations to be obtained easily in a Group III nitride semiconductor include not only a c-plane but also an a-plane and an m-plane. In the Group III nitride semiconductor, the a-plane is a (11-20) plane. In the Group III nitride semiconductor, the m-plane is a (1-100) plane. In $ZnGeN_2$, a single interface is not always formed with respect to each of the a-plane and m-plane of the Group III nitride semiconductor. Even if the Group III nitride semiconductor having no dangling bonds is taken into account as one of the conditions, two or three interfacial models are expectedly present on each of the a-plane and m-plane of the Group III nitride semiconductor. It is determined by computational science which of those interfacial structures is actually taken. In the example to be described below, the interfacial energy between an AlN crystal and a $ZnGeN_2$ crystal is calculated. However, the universality of the computational results is not affected with respect to any other combination of a Group III nitride semiconductor and a Group II-IV nitride semiconductor.

In the following description, five computational models will be described with reference to FIGS. 6-10. In FIGS. 6-10, the interface between an m-plane or a-plane of an AlN crystal and a $ZnGeN_2$ crystal is indicated by the dashed line. Also, in FIGS. 6-10, another atom (i.e., a Zn atom, a Ge atom, or an Al atom) overlapping with each N atom is located behind the N atom in a direction perpendicular to the paper sheet on which each of FIGS. 6-10 is drawn.

Figure 6:
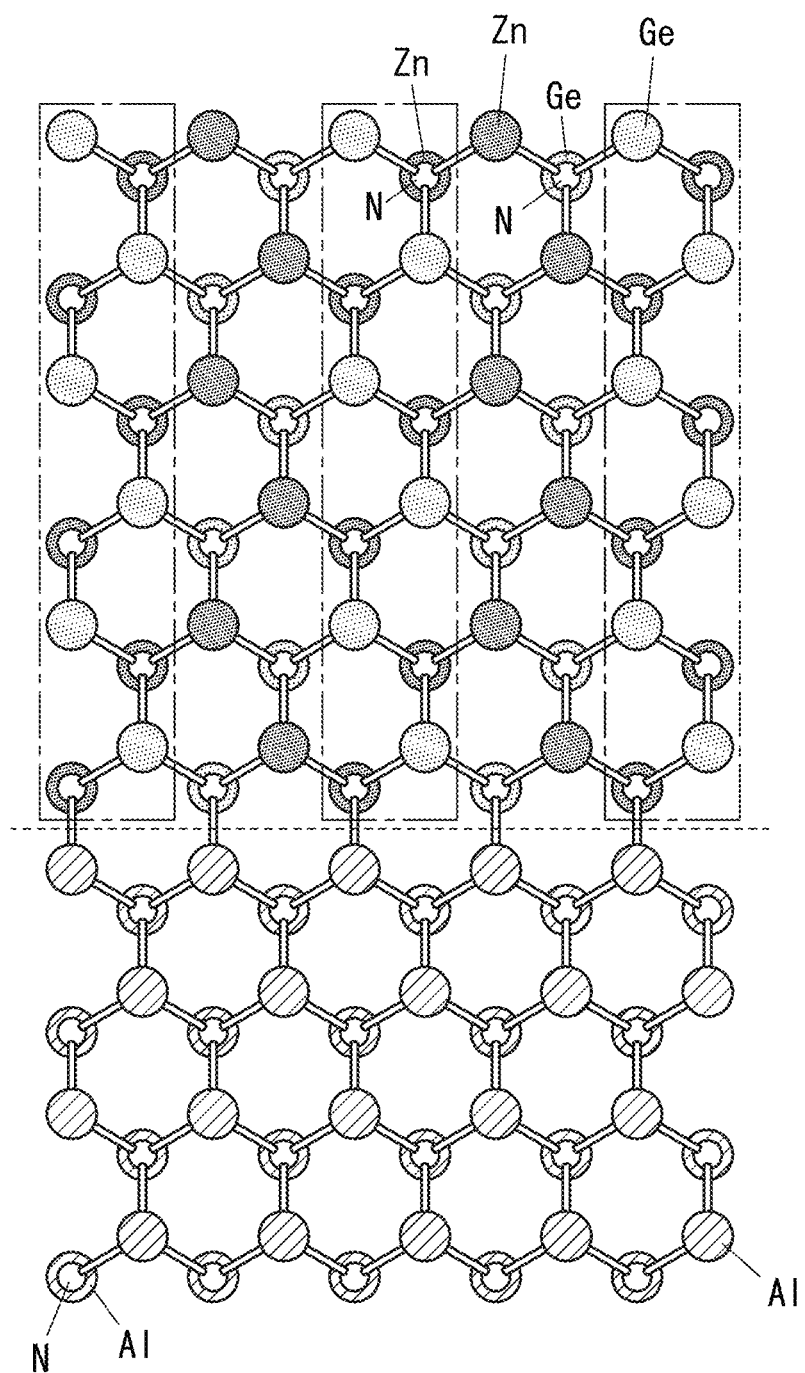
FIG. 6 shows a first model (90/m) calculated with respect to a $ZnGeN_2$/AlN interface.
Figure 7:
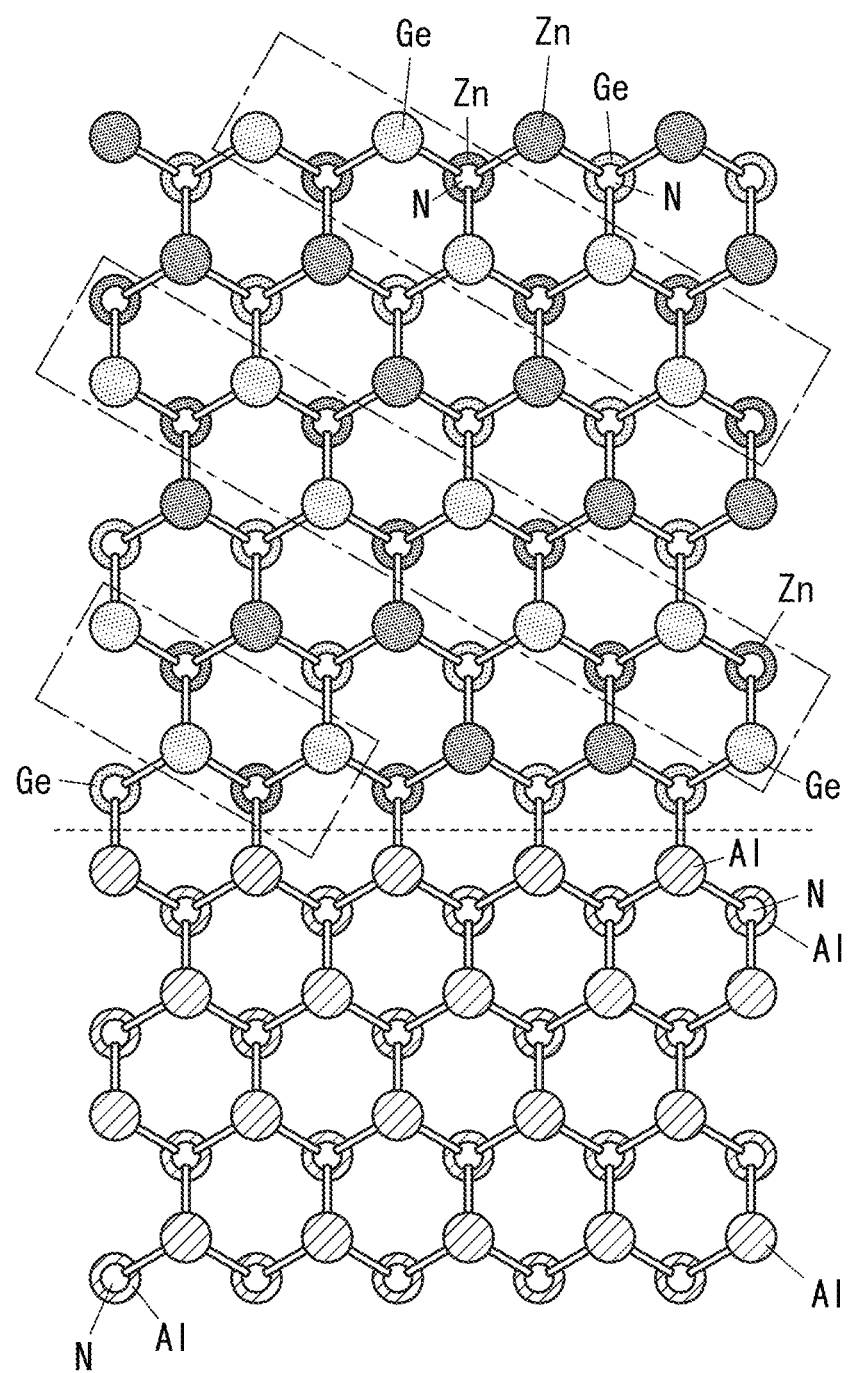
FIG. 7 shows a second model (30/m) calculated with respect to the $ZnGeN_2$/AlN interface.

The interface between an m-plane of the AlN crystal and the $ZnGeN_2$ crystal may be one of the two imaginable types shown in FIGS. 6 and 7, respectively. The first computational model shown in FIG. 6 is a computational model in which banks of Zn atoms and banks of Ge atoms intersect at right angles with the interface and will be hereinafter referred to as a "90/m model." The second computational model shown in FIG. 7 is a computational model in which banks of Zn atoms and banks of Ge atoms intersect obliquely with the interface and will be hereinafter referred to as a "30/m model."

Figure 8:
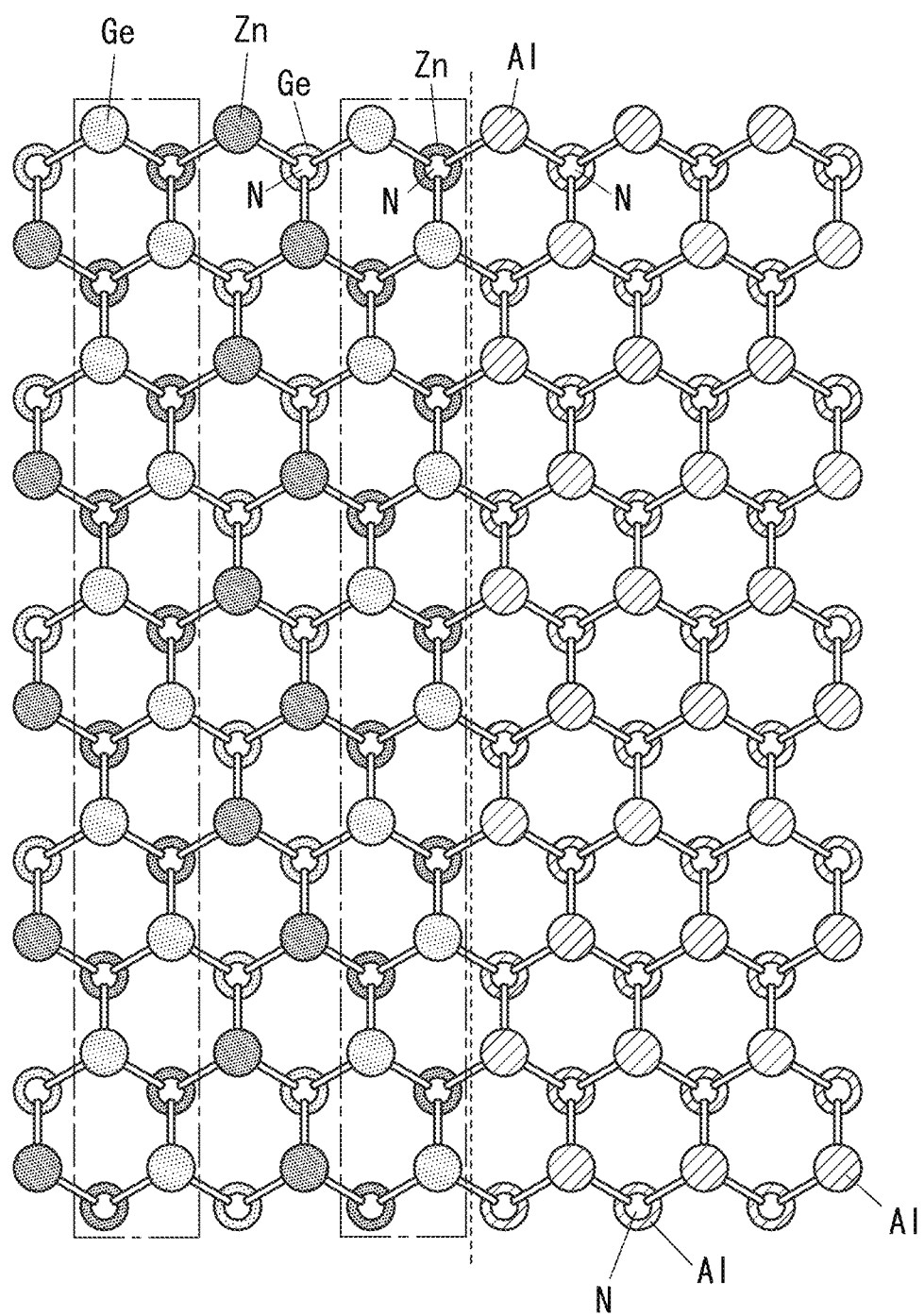
FIG. 8 shows a third model (00/a) calculated with respect to the $ZnGeN_2$/AlN interface.
Figure 9:
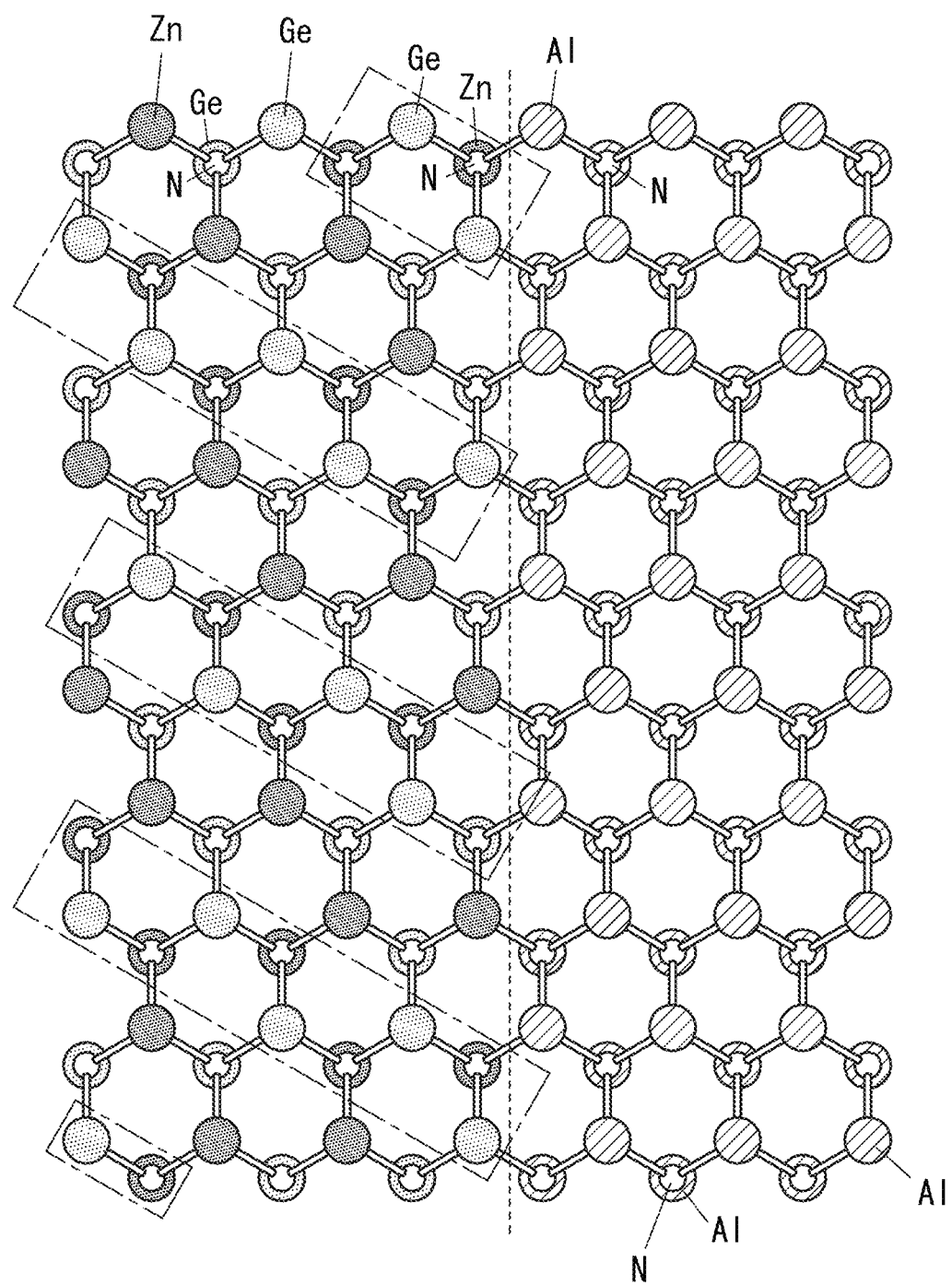
FIG. 9 shows a fourth model (60Ge/a) calculated with respect to the $ZnGeN_2$/AlN interface.
Figure 10:
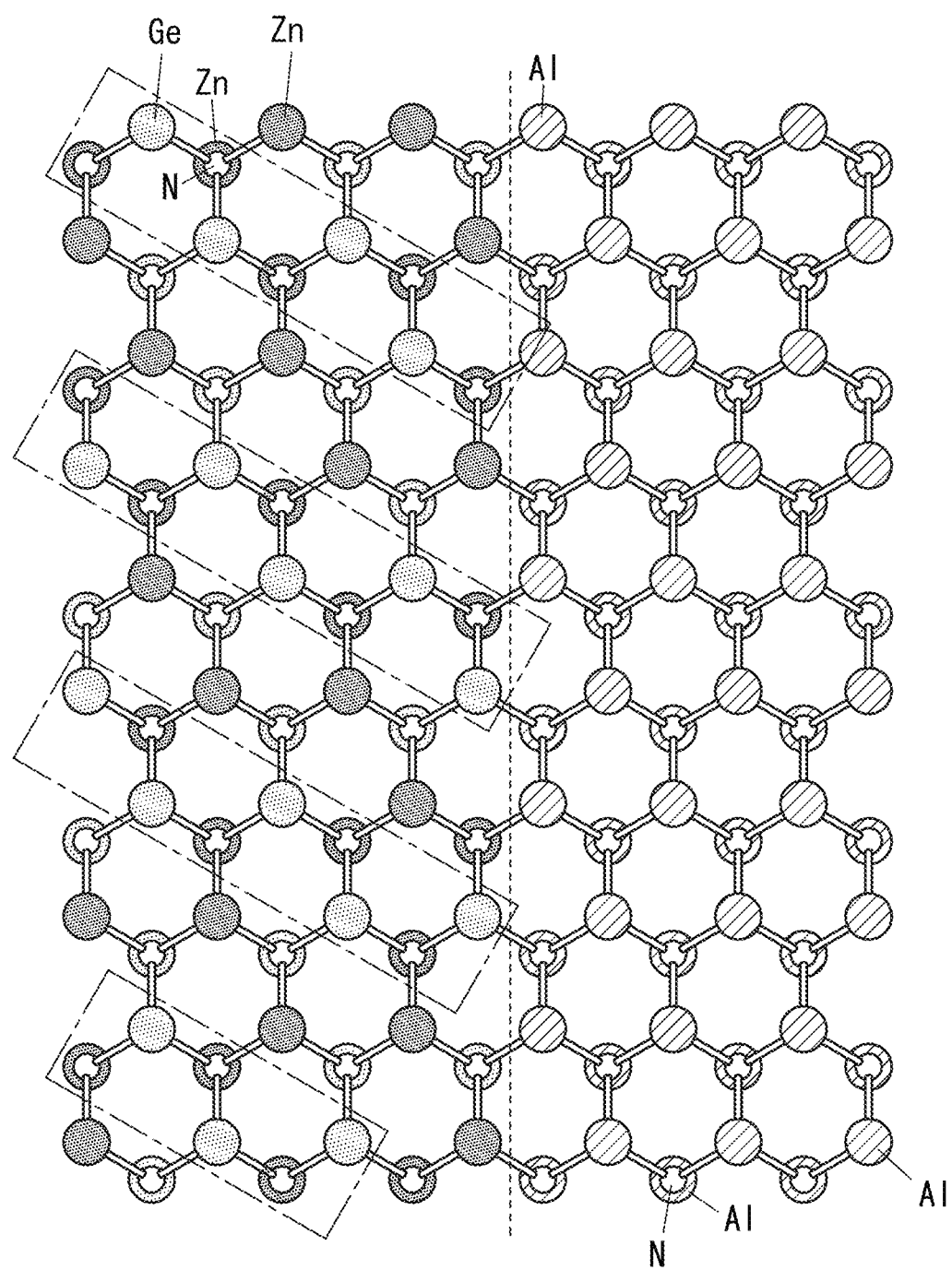
FIG. 10 shows a fifth model (60Zn/a) calculated with respect to the $ZnGeN_2$/AlN interface.

The interface between an a-plane of the AlN crystal and the $ZnGeN_2$ crystal may be one of the three imaginable types shown in FIGS. 8-10, respectively. The third computational model shown in FIG. 8 is a computational model in which banks of Zn atoms and banks of Ge atoms are parallel to the interface and will be hereinafter referred to as a "00/a model." The fourth computational model shown in FIG. 9 is a computational model in which banks of cations are obliquely in contact with the interface and in which the ratio of cations present at the interface is Zn:Ge=1:3 and will be hereinafter referred to as a "60Ge/a model." The fifth computational model shown in FIG. 10 is a computational model in which banks of cations are obliquely in contact with the interface and in which the ratio of cations present at the interface is Zn:Ge=3:1 and will be hereinafter referred to as a "60Zn/a model."

In each of the first through fifth computational models, the total number of atoms is supposed to be 192. The breakdown of the 192 atoms is as follows. As for the AlN crystal, the number of Al atoms is 48 and the number of N atoms is 48. As for the $ZnGeN_2$ crystal, the number of Zn atoms is 24, the number of Ge atoms is 24, and the number of N atoms is 48. In each of the first through fifth computational models, the structural relaxation of the model is performed and then the total energy of the model is calculated. The computational program adopted was the Vienna Ab-initio Simulation Package (VASP) and a pseudo-potential method by plane wave expansion was adopted.

The interfacial energy is defined to be energy obtained by subtracting, from the total energy of a model having an interface, the total energy in a situation where each crystal phase is present by itself. If there is an interface between two crystal phases, each of the two crystal phases is subjected to strain due to a difference in their lattice constant. Therefore, an increment in the energy of each crystal phase due to the strain also needs to be subtracted. This increment in strain energy may be determined uniquely by obtaining an elastic stiffness constant with respect to each crystal phase and by minimizing the balancing condition between force and strain and the strain energy. However, the group of equations has a tensor quantity with twelve components in total and six constraints, connotes coordinate transformation due to anisotropy, and requires determining an unknown number based on the variational principle. Thus, in the following example, the strain energy is obtained by a simple method.

The simple method will now be described.

According to the simple method, with an interfacial model subjected to the structural relaxation placed at the interface, the interfacial mode is divided into two bulk unit cells that are a $ZnGeN_2$ crystal and an AlN crystal. Next, internal structural relaxation is performed with the unit cell length fixed along each of two axes but varied along the other axis at the interface, thereby obtaining total energy. In each of the bulk cell units of the $ZnGeN_2$ crystal and AlN crystal, the sum of the respective unit cell lengths, each measured along the other axis thereof, should be equal to the unit cell length measured along the other axis in the interfacial model. Using this as a constraint, a combination of unit cell lengths measured along the other axis which minimizes the total sum of the energy is obtained. The minimum value is adopted as elastic energy. According to this method, the effect of torsion in each crystal phase is not taken into account. In this case, however, the effect of compressive stress and tensile stress at the interface is assumed to be greater than the effect of torsion in each crystal phase. The magnitude of the interfacial energy calculated should involve a certain degree of error. However, this assumption does not threaten the validity of this discussion.

The following Table 1 summarizes the feature quantities and interfacial energies related to the respective interfaces according to the first to fifth computational models:

TABLE 1

| | Plane orientation of AlN crystal | | | | |
|---|---|---|---|---|---|
| | m-plane: (1-100) plane | | a-plane: (11-20) plane | | |
| Computational model | $1^{st}$ computational model | $2^{nd}$ computational model | $3^{rd}$ computational model | $4^{th}$ computational model | $5^{th}$ computational model |
| Abbreviation of computational model | 90/m | 30/m | 00/a | 60Zn/a | 60Ge/a |
| Angle formed between interface and banks of cations | 90 | 30 | 0 | 60 | 60 |
| Zn:Ge ratio | 1:1 | 1:1 | 1:1 | 3:1 | 1:3 |
| Interfacial energy [eV/cell] | +4.04 | +3.37 | +2.54 | +4.96 | +4.57 |
| [eV/bond] | +0.252 | +0.211 | +0.080 | +0.155 | +0.143 |
| [eV/nm$^2$] | +3.12 | +2.63 | +1.14 | +2.22 | +2.04 |

It can be seen from Table 1 that the computational model "00/a" resulted in a lower interfacial energy than any other one of the first through fifth computational models. The same result was obtained in any of the interfacial energy per cell [eV/cell], the interfacial energy per bonded atom [eV/bond], and the interfacial energy per unit area [eV/nm$^2$]. It can be seen that according to the third to fifth computational models about the interface between the a-plane of the AlN crystal and $ZnGeN_2$ crystal, among other things, the 00/a model resulted in outstandingly low interfacial energy. This result suggests that a crystal having an interfacial structure according to the 00/a model starts to grow on the a-plane of the AlN crystal. This means that on the a-plane of the AlN crystal, the $ZnGeN_2$ crystal is easily grown such that a (11-20) plane of the AlN crystal and a (010) plane of the $ZnGeN_2$ crystal are in contact with each other. Thus, it is expected, considering its selectivity, that the problem of having too many rotary domains jumbled up as seen during the growth of the $ZnGeN_2$ crystal on a c-plane of the AlN crystal would be overcome. It can also be seen that according to the first and second computational models about the interface between the m-plane of the AlN crystal and $ZnGeN_2$ crystal, the 30/m model resulted in the lowest interfacial energy. Thus, it is expected that on the m-plane of the AlN crystal, the $ZnGeN_2$ crystal is easily grown such that a (1-100) plane of the AlN crystal and a (210) plane of the $ZnGeN_2$ crystal are in contact with each other. Nevertheless, the 30/m model and the 90/m model have such an insignificant difference in interfacial energy that the growth of the ZnGeN$_2$ crystal onto the m-plane of the AlN crystal would have lower selectivity than the growth of the ZnGeN$_2$ crystal onto the a-plane of the AlN crystal. Also, if an a-plane terrace were present on an m-plane as the principal surface of the AlN crystal, then the ZnGeN$_2$ crystal would grow preferentially from the a-plane with the lower interfacial energy (in that case, the interfacial structure would be the 00/a model), and therefore, multiple different types of rotary domains could be present in the same region. That is why from the viewpoint of growing a single-domain ZnGeN$_2$ crystal while preventing too many rotary domains from being jumbled up in a confined region, the a-plane of the AlN crystal should be used as a basal plane of the ZnGeN$_2$ crystal rather than the m-plane of the AlN crystal.

In the foregoing description, the selectivity of crystal growth has been discussed by calculating the interfacial energy with respect to the combination of the ZnGeN$_2$ crystal and the AlN crystal. However, this is only an example and should not be construed as limiting. That is to say, it is easily imaginable that the same discussion is applicable to, and the same conclusion is derivable from, any other combination of a Group II-IV nitride semiconductor and a Group III nitride semiconductor. This is because such a combination also resembles the combination of the ZnGeN$_2$ crystal and the AlN crystal in terms of the similarity and difference between their crystal structures and because atoms in different groups have more significantly different chemical properties than atoms in the same group (in other words, on the periodic table, the lateral difference is more significant than the vertical difference). For example, even if any other Group II-IV compound semiconductor such as ZnSiN$_2$, ZnSnN$_2$, MgGeN$_2$, or CaSnN$_2$ is adopted instead of ZnGeN$_2$, the universality will not be affected. The same statement is applicable to even a situation where GaN or InN is adopted instead of AlN.

Although the computational results are not shown here, in the crystal structure of a Group II-IV nitride semiconductor, either a Group II element (such as Zn atom) or a Group IV element (such as a Ge atom) is exposed 100% as a cation on a (011) plane. The (011) plane of a Group II-IV nitride semiconductor corresponds to a (11-22) plane of a Group III nitride semiconductor. In general, a high-index plane has a low degree of symmetry. Thus, the crystal structure of the ZnGeN$_2$ crystal that may be formed on a (11-22) plane of the AlN crystal tends to be limited. Specifically, a (011) plane of the ZnGeN$_2$ crystal easily forms an interface with respect to a (11-22) plane of the AlN crystal and one side, in contact with the ZnGeN$_2$ crystal, of the interface comes to have a structure entirely covered with either Zn atoms or Ge atoms. That is to say, even in such a combination of the (11-22) plane of the Group III nitride semiconductor and the (011) plane of the Group II-IV nitride semiconductor, the problem of having too many rotary domains jumbled up in a confined region is also avoidable.

As can be seen from the foregoing description, the predetermined crystallographic plane of the Group III nitride semiconductor portion 3 is a plane other than a c-plane and may be an a-plane or an m-plane, for example. Of these two planes, the a-plane is preferred to the m-plane.

(3) Fabrication Method

To realize the interfacial structure described above, an AlN substrate, of which the principal surface is an a-plane, for example, may be prepared and a ZnGeN$_2$ crystal may be grown on the principal surface of the AlN substrate. Alternatively, a ZnGeN$_2$ crystal may be grown on an m-plane as the principal surface of an AlN substrate. As a result, a single-domain (single-crystalline) ZnGeN$_2$ crystal, in which too many rotary domains are not jumbled up in a confined region and which exhibits excellent crystallinity, may be obtained.

Actually, however, a practical electronic device uses a Group III nitride semiconductor, of which the principal surface is a c-plane. A Group III nitride semiconductor, of which the principal surface is either an a-plane or an m-plane, is available much less widely than the Group III nitride semiconductor, of which the principal surface is a c-plane. Thus, using such a hard-to-find Group III nitride semiconductor would cause a significant increase in cost. That is why it is important in practice for an electronic device to reduce the number of rotary domains produced while using such a Group III nitride semiconductor, of which the principal surface is a c-plane.

Next, a method for fabricating a nitride semiconductor structure 1, including a Group III nitride semiconductor portion 3 containing AlN as a Group III nitride semiconductor and a Group II-IV nitride semiconductor portion 4 containing ZnGeN$_2$ as a Group II-IV nitride semiconductor, will be described with reference to FIG. 11.

The method for fabricating the nitride semiconductor structure 1 includes the following first through fifth process steps.

The first process step includes providing a single-crystalline silicon wafer 20 (see FIG. 11A) that forms the basis of a single-crystalline silicon substrate 2. The single-crystalline silicon substrate 2 has a first principal surface 21 and a second principal surface 22 opposite from the first principal surface 21. The single-crystalline silicon wafer 20 has a first principal surface 201 and a second principal surface 202 respectively corresponding to the first principal surface 21 and second principal surface 22 of the single-crystalline silicon substrate 2. In this case, the first principal surface 21 of the single-crystalline silicon substrate 2 and the first principal surface 201 of the single-crystalline silicon wafer 20 are each a (111) plane.

Figure 11A:
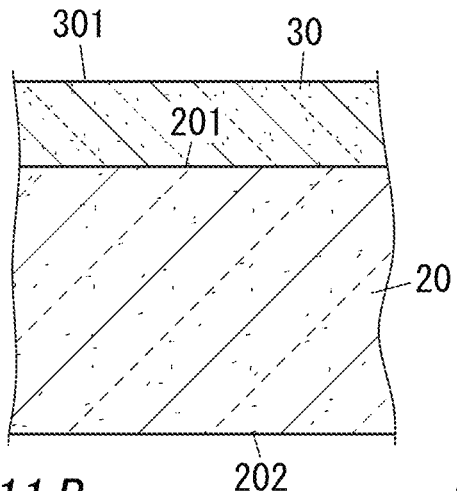
FIGS. 11A-11F are cross-sectional views illustrating respective process steps of a method for fabricating a nitride semiconductor structure according to the first embodiment.
Figure 11B:
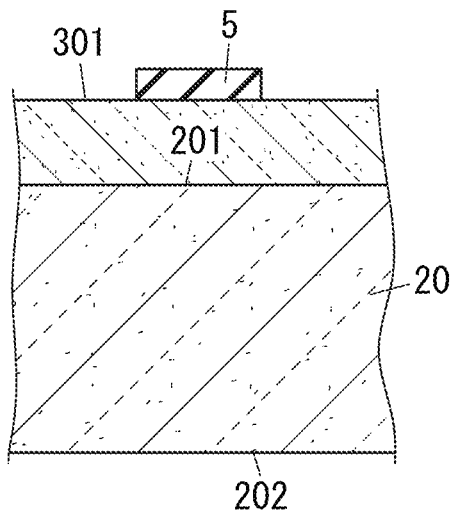

The second process step includes crystal-growing a single-crystalline AlN layer 30, which will be patterned into the Group III nitride semiconductor portion 3, on the first principal surface 201 of the single-crystalline silicon wafer 20 by MOCVD process (see FIG. 11A). The single-crystalline AlN layer 30 may have a thickness of 246 nm, for example. In this case, the principal surface 301 of the single-crystalline AlN layer 30 (i.e., the surface, opposite from the single-crystalline silicon wafer 20, of the single-crystalline AlN layer 30) is a c-plane, i.e., a (0001) plane.

The third process step includes depositing a silicon dioxide film on the principal surface 301 of the single-crystalline AlN layer 30 and then patterning the silicon dioxide film by photolithographic and etching techniques, thereby forming a plurality of silicon dioxide portions 5, each of which formed part of the silicon dioxide film. Note that in FIG. 11B, only one silicon dioxide portion 5 is shown out of the plurality of silicon dioxide portions 5. Each of the plurality of silicon dioxide portions 5 has a straight shape when viewed along the thickness of the single-crystalline silicon wafer 20. The plurality of silicon dioxide portions 5 are arranged in stripes on the principal surface 301 of the single-crystalline AlN layer 30. The plurality of silicon dioxide portions 5 are arranged at regular intervals in one direction (e.g., a direction aligned with the crystal axis [11-20] of the single-crystalline AlN layer 30 in this example) perpendicular to the thickness of the single-crystalline silicon wafer 20 when viewed along the thickness of the single-crystalline silicon wafer 20. As used herein, the "regular intervals" do not have to be exactly the same intervals but may be intervals, of which the difference falls within a prescribed range (e.g., a prescribed distance±20%). When viewed along the thickness of the single-crystalline silicon wafer 20, the longitudinal axis of the plurality of silicon dioxide portions 5 is aligned with the crystal axis [1-100] direction of the single-crystalline AlN layer 30 and the latitudinal axis (i.e., width) of the plurality of silicon dioxide portions 5 is aligned with the crystal axis [11-20] direction of the single-crystalline AlN layer 30.

Figure 11C:
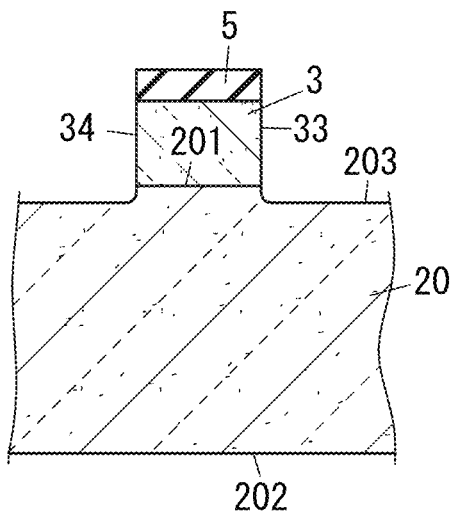
Figure 11D:
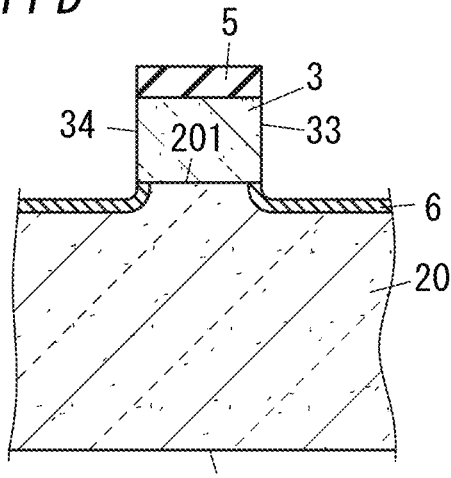

The fourth process step includes patterning the single-crystalline AlN layer 30 to form a plurality of Group III nitride semiconductor portions 3, each of which formed part of the single-crystalline AlN layer 30 (see FIG. 11C). The fourth process step includes a first step of dry-etching the single-crystalline AlN layer 30 using the plurality of silicon dioxide portions 5 as a mask and a second step of performing, after the first step, an annealing treatment to remove the damage caused by the etching process. In each of the plurality of Group III nitride semiconductor portions 3 formed by performing the fourth step, the first side surface 33 thereof is an a-plane of the AlN crystal, i.e., a (11-20) plane. The second side surface 34 of each of the plurality of Group III nitride semiconductor portions 3 is a (-1-120) plane of the AlN crystal. The (-1-120) plane of the AlN crystal is crystallographically equivalent to a (11-20) plane of the AlN crystal. In the first step of the fourth process step, a chlorine-based gas is used as etch gas for dry-etching the single-crystalline AlN layer 30. However, this is only an example and should not be construed as limiting. Alternatively, an argon gas may also be used. In addition, the first step of the fourth process step includes dry-etching the single-crystalline AlN layer 30 using the plurality of silicon dioxide portions 5 as a mask and then dry-etching the single-crystalline silicon wafer 20 to a predetermined depth as well. In the second step of the fourth process step, the annealing condition of the annealing treatment includes, for example, defining a pressure of the atmosphere at ordinary pressure, the atmosphere to be a nitrogen gas atmosphere, the annealing temperature at 700° C., and the annealing time at one hour, for example. Alternatively, the first side surface 33 may be a crystallographic plane, of which an off-axis angle with respect to the a-plane (hereinafter referred to as a "first off-axis angle") is greater than 0 degrees but equal to or less than 5 degrees. As used herein, the "first off-axis angle" is a tilt angle defined by the first side surface 33 with respect to the a-plane. Therefore, if the first off-axis angle is 0 degrees, then the first side surface 33 is an a-plane. Also, in the first step of the fourth process step, the single-crystalline silicon wafer 20 is also partially etched to avoid forming an extra nucleus of a $ZnGeN_2$ crystal when $ZnGeN_2$ crystal is grown in the fifth process step to be described below.

Figure 11E:
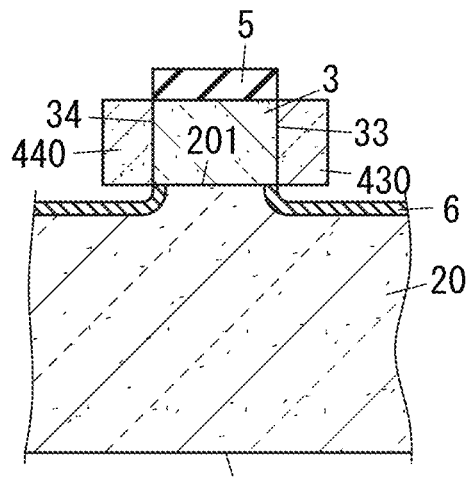
Figure 11F:
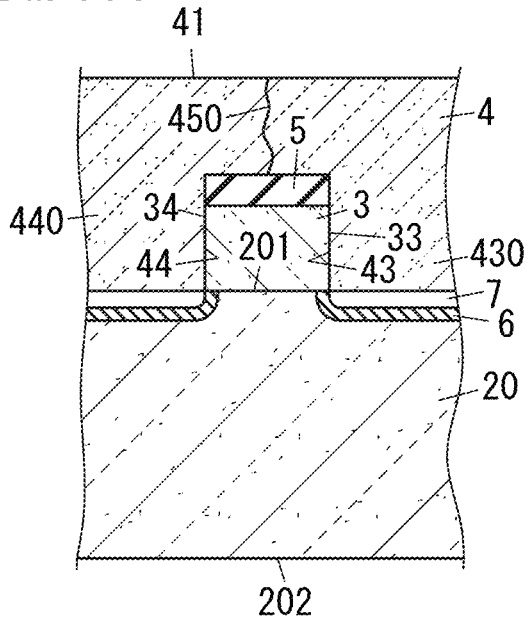

The fifth process step includes loading, after the fourth process step, a wafer including the single-crystalline silicon wafer 20 and the plurality of Group III nitride semiconductor portions 3 into a reactor of an MOCVD system and placing the wafer at a predetermined position inside the reactor to grow a $ZnGeN_2$ crystal. As source materials for Zn, Ge, and N to grow the $ZnGeN_2$ crystal, diethyl zinc, tetraethyl germanium, and ammonia are respectively used. In the fifth process step, after the wafer has been loaded into the reactor, the temperature of the wafer starts to be raised. Thereafter, after the temperature of the wafer has exceeded 400° C., ammonia is introduced into the reactor, thereby reducing the chances of an N atom coming out through the first side surface 33 and second side surface 34 of the Group III nitride semiconductor portion 3. Next, the temperature of the wafer is further raised to beyond 400° C. to nitrify an exposed surface 203 of the single-crystalline silicon wafer 20. In this manner, a silicon nitride film 6 is formed (see FIG. 11D). The nitrification reaction is significantly promoted from 600° C. and on. For example, at 700° C., a dense silicon nitride film 6 is formed to a thickness of 2 nm. The thickness of the silicon nitride film 6 is less than the depth of a recess formed on the first principal surface 201 of the single-crystalline silicon wafer 20 by dry-etching the single-crystalline silicon wafer 20 in the first step of the fourth process step. The silicon nitride film 6 plays the role of a mask when the $ZnGeN_2$ crystal is grown. The wafer temperature is further raised to reach a crystal growing temperature (of 900° C., for example) of $ZnGeN_2$. Then, respective source materials for Zn and Ge start to be supplied. The $ZnGeN_2$ crystal starts to grow from the first side surface 33 and second side surface 34 of each of the plurality of Group III nitride semiconductor portions 3. In this case, according to the results of the computational science described above, a (010) plane of the $ZnGeN_2$ crystal may selectively form an interface with stability with respect to the first side surface 33 of the Group III nitride semiconductor portion 3 (i.e., with respect to the a-plane of the MN crystal). That is to say, this fifth process step enables accomplishing the initial growth while reducing the chances of too many rotary domains being jumbled up in a confined region. FIG. 11E schematically illustrates a $ZnGeN_2$ crystal 430 that has grown from the first side surface 33 of the Group III nitride semiconductor portion 3 perpendicularly to the first side surface 33 (i.e., grown laterally) and a $ZnGeN_2$ crystal 440 that has grown from the second side surface 34 of the Group III nitride semiconductor portion 3 perpendicularly to the second side surface 34 (i.e., grown laterally) In this fifth process step, as the $ZnGeN_2$ crystal is further grown, the $ZnGeN_2$ crystal 430 and the $ZnGeN_2$ crystal 440 grow not only laterally but also perpendicularly to the principal surface as well. Furthermore, the $ZnGeN_2$ crystal 430 and the $ZnGeN_2$ crystal 440 further grow to cover the silicon dioxide portion 5. Eventually, the $ZnGeN_2$ crystal 430 and the $ZnGeN_2$ crystal 440 are combined with each other on the silicon dioxide portion 5. FIG. 11F shows the Group II-IV nitride semiconductor portion 4 including the $ZnGeN_2$ crystal 430 and the $ZnGeN_2$ crystal 440 and a region 450 where the $ZnGeN_2$ crystal 430 and the $ZnGeN_2$ crystal 440 are combined with each other in the Group II-IV nitride semiconductor portion 4. In this case, the $ZnGeN_2$ crystal 430 and the $ZnGeN_2$ crystal 440, in each of which the number of rotary domains produced has been reduced, are combined with each other. Thus, in the combined region 450, Zn and Ge atoms are easily arranged at Zn and Ge sites, respectively. Consequently, in the Group II-IV nitride semiconductor portion 4, the bandgap does not decrease significantly in the combined region 450. The Group II-IV nitride semiconductor portion 4 including the $ZnGeN_2$ crystal 430 and the $ZnGeN_2$ crystal 440 is a $ZnGeN_2$ single crystal. The principal surface 41 of the Group II-IV nitride semiconductor portion 4 is a c-plane of the $ZnGeN_2$ single crystal. Note that as a result of this fifth process step, an air gap 7 is left between the Group II-IV nitride semiconductor portion 4 and the silicon nitride film 6.

In this nitride semiconductor structure 1, the plane orientation of the first side surface 33 of the Group III nitride semiconductor portion 3 is an a-plane of the Group III nitride semiconductor and the plane orientation of the second side surface 34 is crystallographically equivalent to the a-plane. However, this is only an example and should not be construed as limiting. Alternatively, for example, the plane orientation of the first side surface 33 may be an m-plane and the plane orientation of the second side surface 34 may be equivalent to the m-plane. In that case, however, if the a-plane were locally exposed on the first side surface 33 during the manufacturing process, then a $ZnGeN_2$ crystal would grow not only on the m-plane but also on the a-plane as well, thus possibly causing too many rotary domains to be jumbled up in a confined region. Thus, the patterning accuracy of the first side surface 33 is important in that case. In this case, the first side surface 33 may also be a crystallographic plane, of which an off-axis angle with respect to the m-plane (hereinafter referred to as a "second off-axis angle") is greater than 0 degrees and equal to or less than 5 degrees. As used herein, the "second off-axis angle" is a tilt angle defined by the first side surface 33 with respect to the m-plane. Thus, if the second off-axis angle is 0 degrees, then the first side surface 33 is an m-plane. The same statement applies to the patterning accuracy of the second side surface 34 as well.

Also, the nitride semiconductor structure 1 includes the single-crystalline silicon substrate 2 as a supporting substrate for supporting the Group III nitride semiconductor portion 3. However, this is only an example and should not be construed as limiting. Alternatively, the nitride semiconductor structure 1 may include, as the supporting substrate, any substrate other than the single-crystalline silicon substrate 2. That is to say, the material for the supporting substrate does not have to be silicon. Nevertheless, to reduce the chances of rotary domains being produced in the $ZnGeN_2$ crystal to be grown over the Group III nitride semiconductor portion 3 during the manufacturing process of the nitride semiconductor structure 1, the growth of the $ZnGeN_2$ crystal from the supporting substrate needs to be avoided. For that purpose, a masking layer made of a material (such as silicon dioxide or silicon nitride) that reduces the chances of the $ZnGeN_2$ crystal being grown needs to be provided for first principal surface 21 of the single-crystalline silicon substrate 2 (i.e., the surface 203 of the single-crystalline silicon wafer 20).

(4) Advantages

A nitride semiconductor structure 1 according to the first embodiment includes a Group III nitride semiconductor portion 3 and a Group II-IV nitride semiconductor portion 4. The Group III nitride semiconductor portion 3 is single crystalline and has a predetermined crystallographic plane (first side surface 33). The Group II-IV nitride semiconductor portion 4 is provided on the predetermined crystallographic plane of the Group III nitride semiconductor portion 3 and is single crystalline. The Group II-IV nitride semiconductor portion 4 forms a heterojunction with the Group III nitride semiconductor portion 3. The predetermined crystallographic plane (first side surface 33) is a crystallographic plane other than a (0001) plane. The predetermined crystallographic plane (first side surface 33) may be, for example, a (11-20) plane.

The nitride semiconductor structure 1 according to the first embodiment achieves a configuration in which a single-crystalline Group II-IV nitride semiconductor portion 4 is formed over a single-crystalline Group III nitride semiconductor portion 3.

In the Group II-IV nitride semiconductor portion 4, a crystal axis direction perpendicular to the predetermined crystallographic plane is a crystal axis direction other than a [001] direction. This enables reducing the number of rotary domains produced the Group II-IV nitride semiconductor portion 4. In this case, in the Group II-IV nitride semiconductor portion 4, the crystal axis direction perpendicular to the predetermined crystallographic plane (first side surface 33) is a [010] direction. This enables reducing the number of rotary domains produced in the Group II-IV nitride semiconductor portion 4.

Also, a method for fabricating the nitride semiconductor structure 1 according to the first embodiment includes the process step of epitaxially growing a Group II-IV nitride semiconductor portion 4, containing a Group II element and a Group IV element, on a predetermined crystallographic plane (first side surface 33) other than a (0001) plane of the single-crystalline Group III nitride semiconductor portion 3 (i.e., includes the fifth process step described above).

Thus, the method for fabricating the nitride semiconductor structure 1 according to the first embodiment enables achieving a configuration in which a single-crystalline Group II-IV nitride semiconductor portion 4 is formed over a single-crystalline Group III nitride semiconductor portion 3.

The method for fabricating the nitride semiconductor structure 1 according to the first embodiment may prevent too many rotary domains from being jumbled up in a confined region of the Group II-IV nitride semiconductor portion 4, thus enabling improving the characteristic of the Group II-IV nitride semiconductor portion 4 and eventually providing a novel electronic device.

Each of the Group III nitride semiconductor portion 3 and the Group II-IV nitride semiconductor portion 4 may contain impurities. The impurities may include not only impurities to be inevitably contained during the growing process but also dopants to be introduced intentionally during or after the growing process. Examples of the impurities to be inevitably contained during the growing process include hydrogen (H), silicon (Si), carbon (C), and oxygen (O).

The Group II-IV nitride semiconductor may be grown by an MOCVD system that uses the same nitrogen source (such as ammonia) as the Group III nitride semiconductor. This enables an application that the Group II-IV nitride semiconductor is monolithic integrated as control logic for a GaN-based power transistor.

In the nitride semiconductor structure 1 and method for fabricating the same according to the first embodiment, a combination in which $ZnGeN_2$ is used as the Group II-IV nitride semiconductor and AlN is used as the Group III nitride semiconductor has been described as an example as in the computations described above. However, the combination of the Group II-IV nitride semiconductor and the Group III nitride semiconductor does not have to be $ZnGeN_2$ and AlN. Rather, the generality of the nitride semiconductor structure 1 and method for fabricating the same according to the first embodiment is not affected by any combination of Group II-IV and Group III nitride semiconductors other than $ZnGeN_2$ and AlN.

Meanwhile, an electronic device that uses a Group III nitride semiconductor such as gallium nitride tends to cause a thermal runaway due to thermal excitation of carriers less often than an electronic device that uses silicon, and therefore, may operate with good stability even in a temperature range higher than a maximum operating temperature of an electronic device that uses silicon. Nevertheless, in a p-type Group III nitride semiconductor, the hole concentration is not high enough to avoid a significant increase in electrical resistance, which is a drawback of the p-type Group III nitride semiconductor. For example, when p-type gallium nitride is made, magnesium is added as an acceptor element, but the energy level of its valence band is so low that even when magnesium added has a high dopant concentration, nitrogen defects that produce extra electrons are still left to compensate for the holes unintentionally. Thus, it is difficult for an electronic device that uses a Group III nitride semiconductor to obtain p-type gallium nitride with low electrical resistance. This is one of problems with an electronic device that uses a Group III nitride semiconductor.

On the other hand, in a Group II-IV nitride semiconductor such as zinc germanium nitride ($ZnGeN_2$), the 3 d orbit of Zn is located right under the valence band, thus causing significant repulsion between their orbits to raise the valence band on the high energy end. As a result, the dispersion of the valence band increases, and the effective mass of holes decreases. In addition, this increases the chances of the acceptor level and the valence band mixing with each other. For these reasons, it is theoretically predicted that a Group II-IV nitride semiconductor including Zn as a Group II element achieves a high hole concentration.

In the nitride semiconductor structure 1 according to the first embodiment, the Group II element of the Group II-IV nitride semiconductor is zinc. This allows the nitride semiconductor structure 1 according to the first embodiment to provide a p-type semiconductor with an even higher concentration due to the effect of the valence band being raised by the 3 d orbit of zinc while reducing the chances of too many rotary domains being jumbled up in a confined region. Therefore, high-temperature operability with the leakage current reduced by the wide bandgap and a high hole concentration are achieved at a time, thus enabling providing a logic circuit that may operate at a higher temperature than ever.

(5) Exemplary Applications of Nitride Semiconductor Structure

Figure 12:
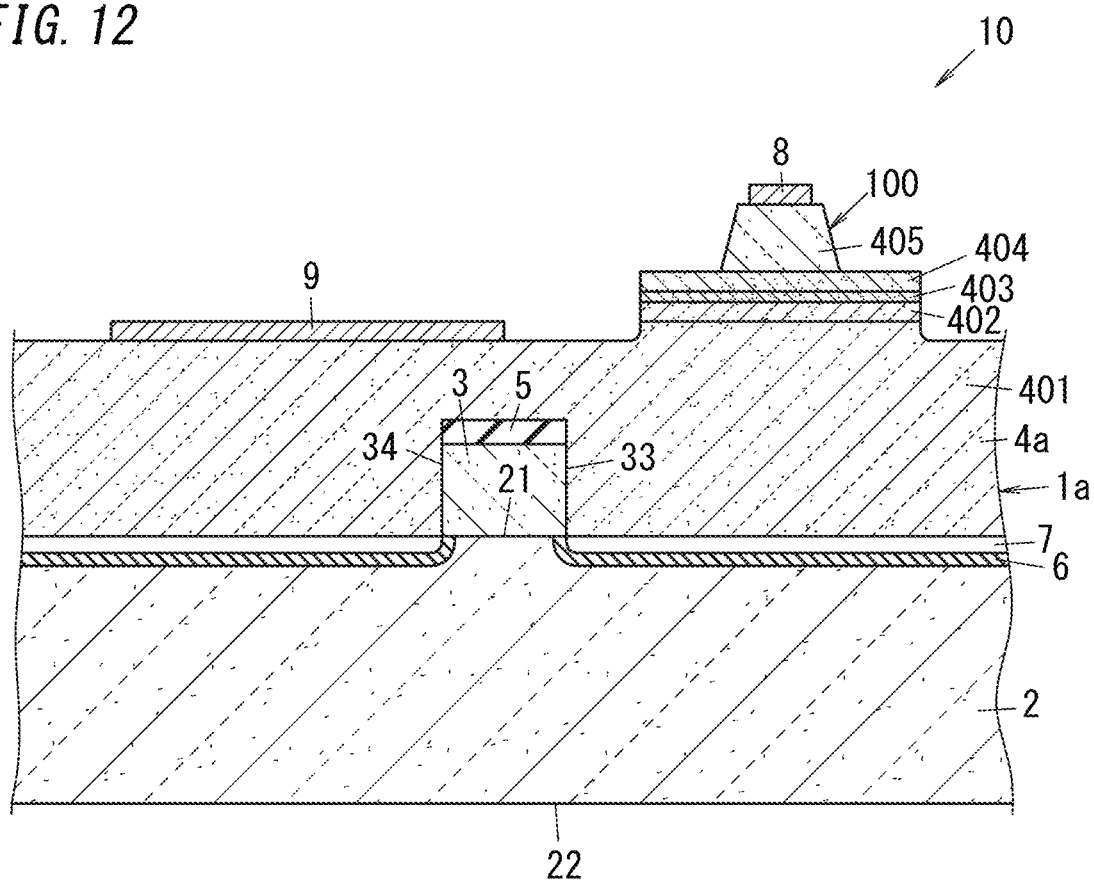
FIG. 12 is a cross-sectional view of a nitride semiconductor device according to the first embodiment.

Next, a nitride semiconductor device 10 will be described with reference to FIG. 12.

The nitride semiconductor device 10 includes a nitride semiconductor structure 1a. The nitride semiconductor structure 1a includes a Group II-IV nitride semiconductor portion 4a instead of the Group II-IV nitride semiconductor portion 4 of the nitride semiconductor structure 1. The nitride semiconductor device 10 includes a semiconductor element 100 including at least a part of the Group II-IV nitride semiconductor portion 4a. In the following description of the nitride semiconductor structure 1a, any constituent element of this nitride semiconductor structure 1a, having the same function as a counterpart of the nitride semiconductor structure 1 described above, will be designated by the same reference numeral as that counterpart's, and description thereof will be omitted herein as appropriate.

The semiconductor element 100 is a light-emitting element that emits light. More specifically, the semiconductor element 100 is a semiconductor laser diode having a current confining structure and a light confinement structure. This semiconductor element 100 emits light (laser beam) perpendicularly to the paper sheet on which FIG. 12 is drawn.

The Group II-IV nitride semiconductor portion 4a, as well as the Group II-IV nitride semiconductor portion 4, has been formed over the Group III nitride semiconductor portion 3.

The Group II-IV nitride semiconductor portion 4a includes: an n-type $ZnGeN_2$ crystal 401; an n-type $ZnGeSnN_2$ crystal 402 formed on a part of the n-type $ZnGeN_2$ crystal 401; a $ZnSnN_2$ crystal 403 formed on the n-type $ZnGeSnN_2$ crystal 402; a p-type $ZnGeSnN_2$ crystal 404 formed on the $ZnSnN_2$ crystal 403; and a p-type $ZnGeN_2$ crystal 405 formed on a part of the p-type $ZnGeSnN_2$ crystal 404. The Group II-IV nitride semiconductor portion 4a, as well as the Group II-IV nitride semiconductor portion 4, has been crystal-grown on the Group III nitride semiconductor portion 3 by MOCVD process. Note that the n-type $ZnGeN_2$ crystal 401 and the n-type $ZnGeSnN_2$ crystal 402 are doped with arsenic (As) as a dopant during their growth and the p-type $ZnGeSnN_2$ crystal 404 and the p-type $ZnGeN_2$ crystal 405 are doped with aluminum (Al) as a dopant during their growth. The Group II-IV nitride semiconductor portion 4a may be formed in the following manner. Specifically, after the n-type $ZnGeN_2$ crystal 401 has been grown on the Group III nitride semiconductor portion 3, the n-type $ZnGeSnN_2$ crystal 402, the $ZnSnN_2$ crystal 403, the p-type $ZnGeSnN_2$ crystal 404, and the p-type $ZnGeN_2$ crystal 405 are grown thereon in this order. Thereafter, part of the multilayer structure including the n-type $ZnGeN_2$ crystal 401, the n-type $ZnGeSnN_2$ crystal 402, the $ZnSnN_2$ crystal 403, the p-type $ZnGeSnN_2$ crystal 404, and the p-type $ZnGeN_2$ crystal 405 is patterned by being etched from the principal surface of the p-type $ZnGeN_2$ crystal 405, thereby forming the Group II-IV nitride semiconductor portion 4a.

The semiconductor element 100 includes an anode electrode 8 and a cathode electrode 9. The anode electrode 8 has been formed on, and is electrically connected to, the p-type $ZnGeN_2$ crystal 405. The cathode electrode 9 has been formed on, and is electrically connected to, the n-type $ZnGeN_2$ crystal 401.

In the semiconductor element 100, the n-type $ZnGeN_2$ crystal 401, the n-type $ZnGeSnN_2$ crystal 402, the $ZnSnN_2$ crystal 403, the p-type $ZnGeSnN_2$ crystal 404, and the p-type $ZnGeN_2$ crystal 405 constitute an n-type contact layer, an n-type cladding layer, an active layer, a p-type cladding layer, and a p-type contact layer, respectively.

The Group II-IV nitride semiconductor portion 4a includes, as an n-type semiconductor region, the n-type $ZnGeN_2$ crystal 401 and the n-type $ZnGeSnN_2$ crystal 402.

The Group II-IV nitride semiconductor portion 4a includes, as a p-type semiconductor region, the p-type $ZnGeSnN_2$ crystal 404 and the p-type $ZnGeN_2$ crystal 405.

The semiconductor element 100 includes at least a part (e.g., all in this example) of the n-type semiconductor region and at least a part (e.g., all in this example) of the p-type semiconductor region.

The nitride semiconductor device 10 described above includes a semiconductor element 100 including at least a part of the Group II-IV nitride semiconductor portion 4a of the nitride semiconductor structure 1a. This allows the nitride semiconductor device 10 to achieve a configuration in which the single-crystalline Group II-IV nitride semiconductor portion 4a is formed over the single-crystalline Group III nitride semiconductor portion 3.

Also, in the nitride semiconductor device 10, the semiconductor laser diode as an exemplary semiconductor element 100 includes the Group II-IV nitride semiconductor portion 4a. However, this is only an example and should not be construed as limiting. Alternatively, the semiconductor laser diode as an exemplary semiconductor element 100 may include the Group III nitride semiconductor portion 3. In that case, while the nitride semiconductor device 10 is fabricated, a Group III nitride semiconductor multilayer structure to be patterned into the Group III nitride semiconductor portion 3 is formed as a prototype of the semiconductor laser diode. Thereafter, the Group III nitride semiconductor multilayer structure is patterned by etching into a narrow striped shape with a width of 1 μm, for example. Subsequently, an undoped Group II-IV nitride semiconductor is crystal-grown on a side surface of the Group III nitride semiconductor multilayer structure. In this manner, a semiconductor laser diode having a lateral current confining structure and a lateral light confinement structure may be obtained. This semiconductor laser diode may achieve the advantage of eliminating a dispersion in a beam shape that has been caused in known semiconductor laser diodes due to the residual thickness of a ridge waveguide.

Second Embodiment

Figure 13:
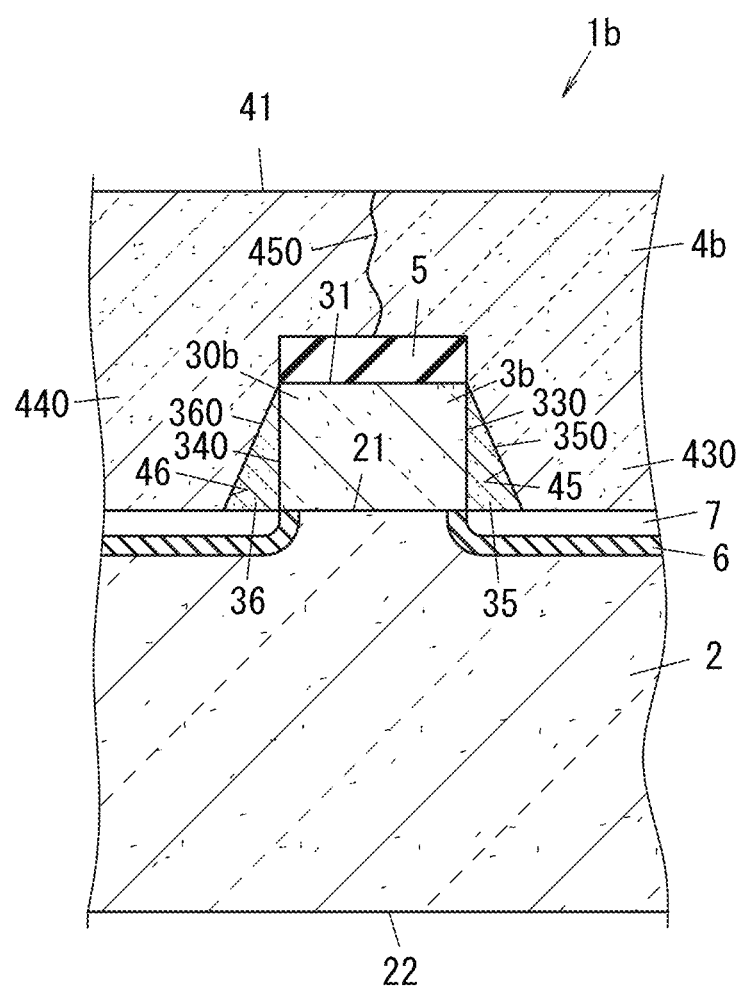
FIG. 13 is a cross-sectional view of a nitride semiconductor structure according to a second embodiment.

Next, a nitride semiconductor structure 1b according to a second embodiment will be described with reference to FIG. 13. In the following description, any constituent element of the nitride semiconductor structure 1b according to this second embodiment, having the same function as a counterpart of the nitride semiconductor structure 1 according to the first embodiment described above, will be designated by the same reference numeral as that counterpart's, and description thereof will be omitted herein.

The nitride semiconductor structure 1b includes a Group III nitride semiconductor portion 3b and a Group II-IV nitride semiconductor portion 4b instead of the Group III nitride semiconductor portion 3 and the Group II-IV nitride semiconductor portion 4 according to the first embodiment.

In the nitride semiconductor structure 1b according to the second embodiment, the Group III nitride semiconductor portion 3b includes: an AlN crystal 30b having a principal surface 31, a first side surface 330, and a second side surface 340; a first GaN crystal 35 grown on the first side surface 330 of the AlN crystal 30b; and a second GaN crystal 36 grown on the second side surface 340 of the AlN crystal 30b. The Group III nitride semiconductor portion 3 has a rectangular cross-sectional shape taken along a plane intersecting at right angles with the longitudinal axis thereof. On the other hand, the Group III nitride semiconductor portion 3b has a trapezoidal cross-sectional shape taken along a plane intersecting at right angles with the longitudinal axis thereof.

The Group II-IV nitride semiconductor portion 4b has been crystal-grown on the principal surface 350 of the first GaN crystal 35 of the Group III nitride semiconductor portion 3b and on the principal surface 360 of the second GaN crystal 36 of the Group III nitride semiconductor portion 3b. The principal surface 350 of the first GaN crystal 35 is the predetermined crystallographic plane. The principal surface 350 of the first GaN crystal 35 is a (11-22) plane of the first GaN crystal 35. The principal surface 360 of the second GaN crystal 36 is a (-1-122) plane of the second GaN crystal 36. This may reduce the number of rotary domains produced in the Group II-IV nitride semiconductor portion 4b.

In the Group II-IV nitride semiconductor portion 4b, the crystal axis direction perpendicular to the predetermined crystallographic plane (principal surface 350) is a [011] direction. This may reduce the number of rotary domains produced in the Group II-IV nitride semiconductor portion 4b grown on the principal surface 350 of the first GaN crystal 35. In addition, in the Group II-IV nitride semiconductor portion 4b, the crystal axis direction perpendicular to the principal surface 360 of the second GaN crystal 36 is a [0-11] direction. This may reduce the number of rotary domains produced in the Group II-IV nitride semiconductor portion 4b grown on the principal surface 360 of the second GaN crystal 36.

Next, a method for fabricating the nitride semiconductor structure 1b according to the second embodiment will be described with reference to FIGS. 11A and 11B and FIGS. 14A-14D. In the following description, as for any process step according to this second embodiment, corresponding to a counterpart of the method for fabricating the nitride semiconductor structure 1 according to the first embodiment described above, description thereof will be omitted herein as appropriate.

The method for fabricating the nitride semiconductor structure 1b includes the following first through seventh process steps.

The first process step includes providing a single-crystalline silicon wafer 20 (see FIG. 11A) that forms the basis of the single-crystalline silicon substrate 2. The single-crystalline silicon wafer 20 has a first principal surface 201 and a second principal surface 202. In this case, the first principal surface 201 of the single-crystalline silicon substrate 2 is a (111) plane.

The second process step includes crystal-growing a single-crystalline AlN layer 30, which will be patterned into an AlN crystal 30b of the Group III nitride semiconductor portion 3, on the first principal surface 201 of the single-crystalline silicon wafer 20 by MOCVD process (see FIG. 11A). In this case, the principal surface 301 of the single-crystalline AlN layer 30 (i.e., the surface, opposite from the single-crystalline silicon wafer 20, of the single-crystalline AlN layer 30) is a c-plane, i.e., a (0001) plane.

The third process step includes depositing a silicon dioxide film on the principal surface 301 of the single-crystalline AlN layer 30 and then patterning the silicon dioxide film by photolithographic and etching techniques, thereby forming a plurality of silicon dioxide portions 5, each of which formed part of the silicon dioxide film. Note that in FIG. 11B, only one silicon dioxide portion 5 is shown out of the plurality of silicon dioxide portions 5. Each of the plurality of silicon dioxide portions 5 has a straight shape when viewed along the thickness of the single-crystalline silicon wafer 20. The plurality of silicon dioxide portions 5 are arranged in stripes on the principal surface 301 of the single-crystalline AlN layer 30. The longitudinal axis of the plurality of silicon dioxide portions 5 is aligned with the crystal axis [1-100] direction of the single-crystalline AlN layer 30 and the latitudinal axis (i.e., width) of the plurality of silicon dioxide portions 5 is aligned with the crystal axis [11-20] direction of the single-crystalline AlN layer 30.

Figure 14A:
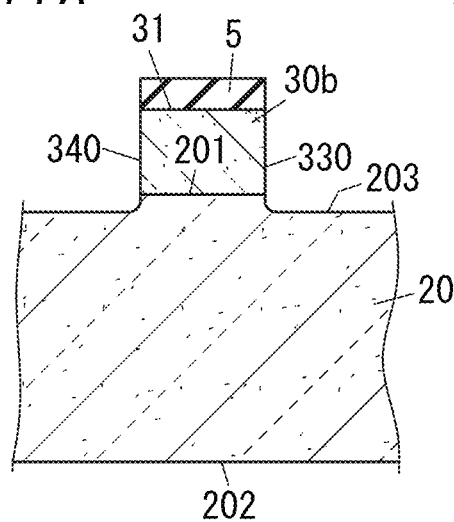
FIGS. 14A-14D are cross-sectional views illustrating respective process steps of a method for fabricating the nitride semiconductor structure.

The fourth process step includes patterning the single-crystalline AlN layer 30 to form a plurality of AlN crystals 30b, each of which formed part of the single-crystalline AlN layer 30 (see FIG. 14A). The fourth process step includes a first step of dry-etching the single-crystalline AlN layer 30 using the plurality of silicon dioxide portions 5 as a mask and a second step of performing, after the first step, an annealing treatment to remove the damage caused by the etching process. In each of the plurality of AlN crystals 30b formed by performing the fourth process step, the first side surface 330 thereof is an a-plane of the AlN crystal, i.e., a (11-20) plane. The second side surface 340 of each of the plurality of AlN crystals 30b is a (-1-120) plane of the AlN crystal. The (-1-120) plane of the AlN crystal is crystallographically equivalent to a (11-20) plane of the AlN crystal.

The fifth process step includes loading, after the fourth process step, a wafer including the single-crystalline silicon wafer 20 and the plurality of AlN crystals 30b into a reactor of an MOCVD system and placing the wafer at a predetermined position inside the reactor. Subsequently, the temperature of the wafer starts to be raised. Thereafter, after the temperature of the wafer has exceeded 400° C., ammonia is introduced into the reactor, thereby reducing the chances of an N atom coming out through the first side surface 330 and second side surface 340 of the AlN crystal 30b. Next, the temperature of the wafer is further raised to beyond 400° C.

to nitrify an exposed surface 203 of the single-crystalline silicon wafer 20. In this manner, a silicon nitride film 6 is formed (see FIG. 14B).

Figure 14C:
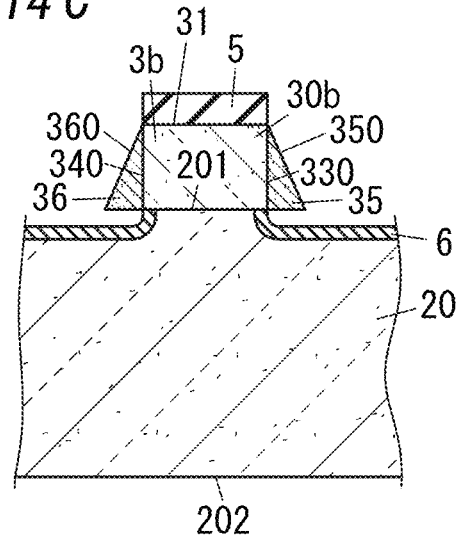
Figure 14B:
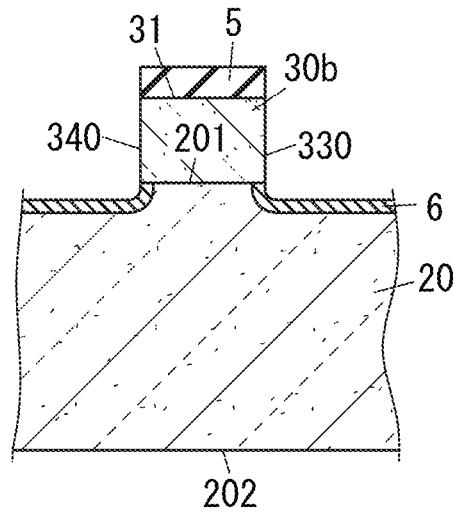

The sixth process step includes respectively growing the first GaN crystal 35 and the second GaN crystal 36 on the first side surface 330 and second side surface 340 of the AlN crystal 30b in the MOCVD system (see FIG. 14C). As a result, a plurality of Group III nitride semiconductor portions 3, each including the AlN crystal 30b, the first GaN crystal 35, and the second GaN crystal 36, are formed. In the sixth process step, after a predetermined growth temperature has been reached, a Ga source material (such as trimethyl gallium) starts to be supplied into the reactor of the MOCVD system. In the meantime, the first GaN crystal 35 and the second GaN crystal 36 are respectively grown on the first side surface 330 and second side surface 340 of the AlN crystal 30b. In this case, if the crystal growing process were carried out with the flow rate of ammonia decreased, then a (11-22) plane of the GaN crystal would lose stability to cause a significant decrease in the crystal growth rate, because the uppermost surface region of the (11-20) plane is made up of nitrogen atoms. As a result, a wedge-shaped first GaN crystal 35, of which the principal surface 350 is defined to be a (11-22) plane due to the limitation of the growth rate, and a wedge-shaped second GaN crystal 36, of which the principal surface 360 is defined to be a (-1-122) plane due to the limitation of the growth rate, are formed. In that case, each of the principal surfaces 350 and 360 has a surface structure that has been aligned on an atomic order. When the first GaN crystal 35 and the second GaN crystal 36 complete their growth, the Ga source material stops to be supplied.

Figure 14D:
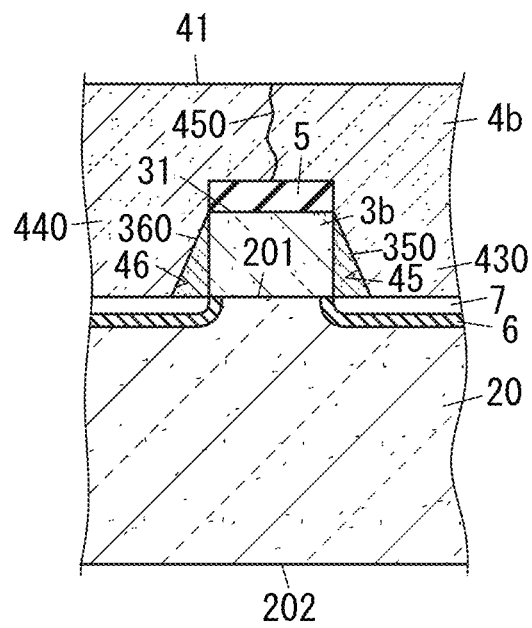

The seventh process step includes growing a $ZnGeN_2$ crystal, which will form the Group II-IV nitride semiconductor portion 4b, on the respective principal surfaces 350 and 360 of the Group III nitride semiconductor portion 3b. When the $ZnGeN_2$ crystal is grown, diethyl zinc, tetraethyl germanium, and ammonia are used as respective source materials for Zn, Ge, and N. In the seventh process step, after the Ga source material has stopped being supplied in the sixth process step, the Zn source material and ammonia start to be supplied. Zn has a high vapor pressure and $Zn_3N_2$, which is a nitride of Zn, has poor thermal stability. Thus, no $Zn_3N_2$ will be deposited on the principal surface 350 of the first GaN crystal 35 (i.e., the first side surface of the Group III nitride semiconductor portion 3b) or the principal surface 360 of the second GaN crystal 36 (i.e., the second side surface of the Group III nitride semiconductor portion 3b) but Zn will be just adsorbed on an atomic layer order into the principal surface 350 of the first GaN crystal 35 and the principal surface 360 of the second GaN crystal 36. Thus, an initially grown layer of the $ZnGeN_2$ crystal in the interface between the Group III nitride semiconductor portion 3b and the Group II-IV nitride semiconductor portion 4b is uniquely determined to be a Zn layer. After Zn has been sufficiently adsorbed into the principal surface 350 of the first GaN crystal 35 and the principal surface 360 of the second GaN crystal 36, the Ga source material will also start to be supplied. This causes the $ZnGeN_2$ crystal to start growing. Since the plane orientation of the bonding face between the $ZnGeN_2$ crystal and the Group III nitride semiconductor portion 3b is (011) and the initially grown layer is a Zn layer, the number of rotary domains produced on the growing surface may be reduced. In FIG. 14D, as well as in FIG. 11F, the Group II-IV nitride semiconductor portion 4b including the $ZnGeN_2$ crystal 430 and the $ZnGeN_2$ crystal 440 and the combined region 450 between the $ZnGeN_2$ crystal 430 and the $ZnGeN_2$ crystal 440 in the Group II-IV nitride semiconductor portion 4b are also shown. In this case, the $ZnGeN_2$ crystal 430 and the $ZnGeN_2$ crystal 440, in each of which the number of rotary domains produced has been reduced, are combined with each other. Thus, in the combined region 450, Zn atoms and Ge atoms are easily arranged at Zn sites and Ge sites, respectively. Consequently, in the Group II-IV nitride semiconductor portion 4b, the bandgap does not decrease significantly in the combined region 450. The Group II-IV nitride semiconductor portion 4b including the $ZnGeN_2$ crystal 430 and the $ZnGeN_2$ crystal 440 is a $ZnGeN_2$ single crystal. The principal surface 41 of the Group II-IV nitride semiconductor portion 4b is a c-plane of the $ZnGeN_2$ single crystal.

Optionally, the seventh process step may include depositing, before starting growing the $ZnGeN_2$ crystal, a Group III nitride semiconductor including aluminum on the principal surface 350 of the first GaN crystal 35 and the principal surface 360 of the second GaN crystal 36 to form the first side surface and second side surface of the Group III nitride semiconductor portion 3b. The reason is that the bonding energy between aluminum and nitrogen is greater than the bonding energy between gallium and nitrogen and therefore this option is effective in reducing mixture of $ZnGeN_2$ and GaN at their interface.

The method for fabricating the nitride semiconductor structure 1b described above includes epitaxially growing, on a predetermined crystallographic plane (principal surface 350) other than a (0001) plane of a single-crystalline Group III nitride semiconductor portion 3b containing a Group III element, a single-crystalline Group II-IV nitride semiconductor portion 4b containing a Group II element and a Group IV element (i.e., includes the seventh process step described above). Thus, the method for fabricating the nitride semiconductor structure 1b enables achieving a configuration in which the single-crystalline Group II-IV nitride semiconductor portion 4b has been formed over the single-crystalline Group III nitride semiconductor portion 3b.

Third Embodiment

Figure 15:
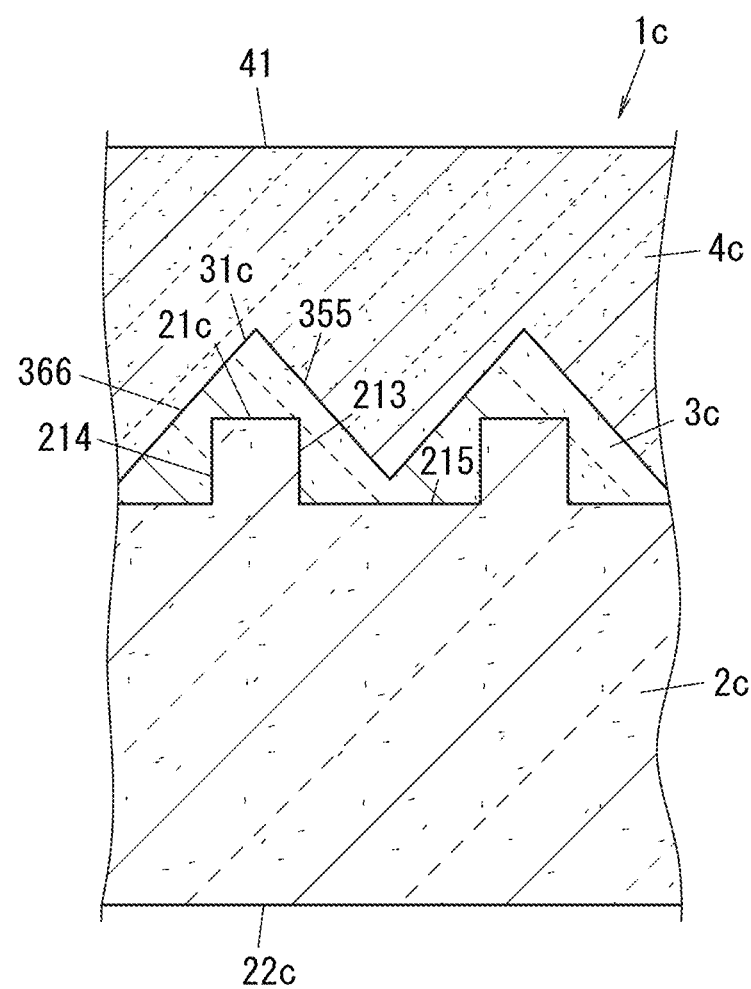
FIG. 15 is a cross-sectional view of a nitride semiconductor structure according to a third embodiment.

Next, a nitride semiconductor structure 1c according to a third embodiment will be described with reference to FIG. 15. In the following description, any constituent element of the nitride semiconductor structure 1c according to this third embodiment, having the same function as a counterpart of the nitride semiconductor structure 1 according to the first embodiment described above, will be designated by the same reference numeral as that counterpart's, and description thereof will be omitted herein.

The nitride semiconductor structure 1c according to the third embodiment includes, instead of the single-crystalline silicon substrate 2 serving as a supporting substrate for the nitride semiconductor structure 1 according to the first embodiment, a Group III nitride semiconductor substrate 2c having a first principal surface 21c and a second principal surface 22c. The Group III nitride semiconductor substrate 2c has a wurtzite crystal structure. The Group III nitride semiconductor substrate 2c may be a GaN substrate, for example. In addition, the nitride semiconductor structure 1c according to the third embodiment includes, instead of the Group III nitride semiconductor portion 3 and Group II-IV nitride semiconductor portion 4 of the nitride semiconductor structure 1 according to the first embodiment, a Group III nitride semiconductor portion 3c and a Group II-IV nitride semiconductor portion 4c.

On the first principal surface 21c of the Group III nitride semiconductor substrate 2c, a plurality of recesses 215 are formed. Each of the plurality of recesses 215 has a linear shape when viewed along the thickness of the Group III nitride semiconductor substrate 2c. The plurality of recesses 215 are arranged in stripes when viewed along the thickness of the Group III nitride semiconductor substrate 2c. The plurality of recesses 215 are arranged at regular intervals in one direction perpendicular to the thickness of the Group III nitride semiconductor substrate 2c when viewed along the thickness of the Group III nitride semiconductor substrate 2c. As used herein, the "regular intervals" do not have to be exactly the same intervals but may be intervals, of which the difference falls within a prescribed range (e.g., a prescribed distance±20%). When viewed along the thickness of the Group III nitride semiconductor substrate 2c, the longitudinal axis of the plurality of recesses 215 is aligned with the crystal axis [1-100] direction of the Group III nitride semiconductor substrate 2c and the latitudinal axis (width) of the plurality of recesses 215 is aligned with the crystal axis [11-20] direction of the Group III nitride semiconductor substrate 2c. A region between two adjacent recesses 215 includes a portion of the first principal surface 21c, a first side surface 213, and a second side surface 214. The first side surface 213 is an inner side surface of one of the two adjacent recesses 215. The second side surface 214 is an inner side surface of the other recess 215. The first side surface 213 is an a-plane of the GaN crystal, i.e., a (11-20) plane. The second side surface 214 is a (-1-120) plane of the GaN crystal.

In the nitride semiconductor structure 1c according to the third embodiment, the Group III nitride semiconductor portion 3c is made up of the GaN crystal. The other principal surface 31c, opposite from the Group III nitride semiconductor substrate 2c, of the Group III nitride semiconductor portion 3c includes a first surface 355 and a second surface 366. The first surface 355 is a (11-22) plane of the GaN crystal. The second surface 366 is a (-1-122) plane of the GaN crystal. This may reduce the number of rotary domains produced in the Group II-IV nitride semiconductor portion 4c. In the nitride semiconductor structure 1c, the first surface 355 of the Group III nitride semiconductor portion 3c is the predetermined crystallographic plane.

In the Group II-IV nitride semiconductor portion 4c, the crystal axis direction perpendicular to the first surface 355 is a [011] direction. Also, in the Group II-IV nitride semiconductor portion 4c, the crystal axis direction perpendicular to the second surface 366 is a [0-11] direction. This may reduce the number of rotary domains produced in the Group II-IV nitride semiconductor portion 4c.

Next, a method for fabricating the nitride semiconductor structure 1c according to the third embodiment will be described with reference to FIGS. 16A-16C. In the following description, as for any process step according to this third embodiment, corresponding to a counterpart of the method for fabricating the nitride semiconductor structure 1 according to the first embodiment described above, description thereof will be omitted herein as appropriate.

The method for fabricating the nitride semiconductor structure 1c includes the following first to third process steps.

Figure 16A:
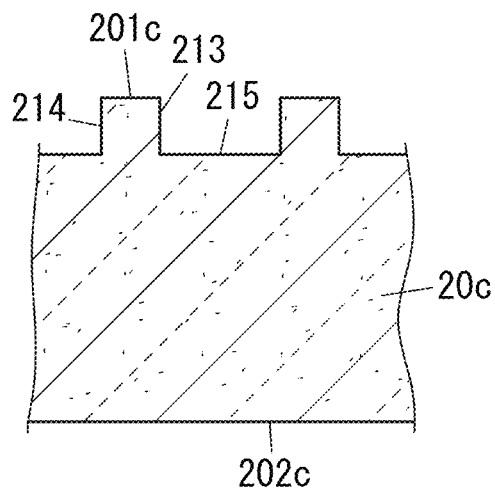
FIGS. 16A-16C are cross-sectional views illustrating respective process steps of a method for fabricating the nitride semiconductor structure.
Figure 16B:
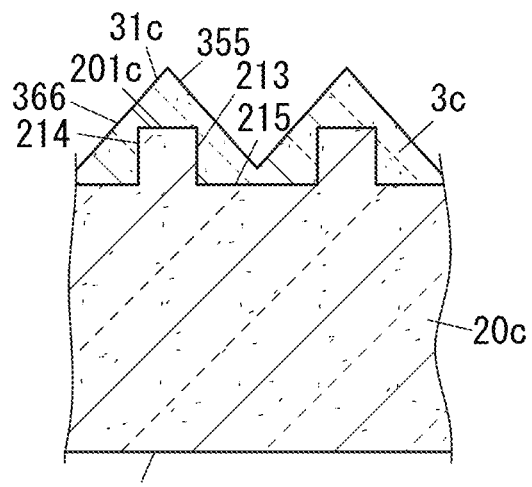

The first process step includes providing a Group III nitride semiconductor wafer 20c having a plurality of recesses 215 (see FIG. 16A). The Group III nitride semiconductor wafer 20c is a wafer that forms the basis of the Group III nitride semiconductor substrate 2c. The Group III nitride semiconductor substrate 2c has a first principal surface 21c and a second principal surface 22c. The Group III nitride semiconductor wafer 20c has a first principal surface 201c and a second principal surface 202c respectively corresponding to the first principal surface 21c and the second principal surface 22c of the Group III nitride semiconductor substrate 2c.

The second process step includes loading the Group III nitride semiconductor wafer 20c into a reactor of an MOCVD system and raising the temperature while supplying ammonia as a nitrogen source material thereto. When the temperature reaches a desired crystal growing temperature of the GaN crystal that forms the Group III nitride semiconductor portion 3c, a Ga source material (such as trimethyl gallium) starts to be supplied, thereby starting growing a GaN crystal on the first principal surface 201c, the first side surface 213, the second side surface 214, and the bottom surface of the recesses 215 of the Group III nitride semiconductor wafer 20c. In this second process step, a crystal growing condition for reducing the crystal growth from the first side surface 213 and the second side surface 214 is adopted. In this case, nitrogen is exposed more broadly on the first side surface 213 and the second side surface 214 than on the first principal surface 201c. That is why a crystal growing condition that reduces the adsorption of nitrogen onto the first side surface 213 and the second side surface 214 is preferably adopted. Such a crystal growing condition involves at least one of, for example, decreasing the flow rate of ammonia, increasing the flow rate of the Ga source material, lowering the crystal growing temperature to reduce the decomposition efficiency of ammonia, or increasing the proportion of a hydrogen gas in a carrier gas including the hydrogen gas and a nitrogen gas to facilitate adsorption of hydrogen onto the first side surface 213 and the second side surface 214 and thereby inhibit adsorption of nitrogen onto the first side surface 213 and the second side surface 214. Adopting such a crystal growing condition allows a Group III nitride semiconductor portion 3c made up of a GaN crystal (GaN regrown layer) having a first surface 355 and a second surface 366 to be formed as shown in FIG. 16B. The first surface 355 is a (11-22) plane of the GaN crystal. The second surface 366 is a (-1-22) plane of the GaN crystal.

Figure 16C:
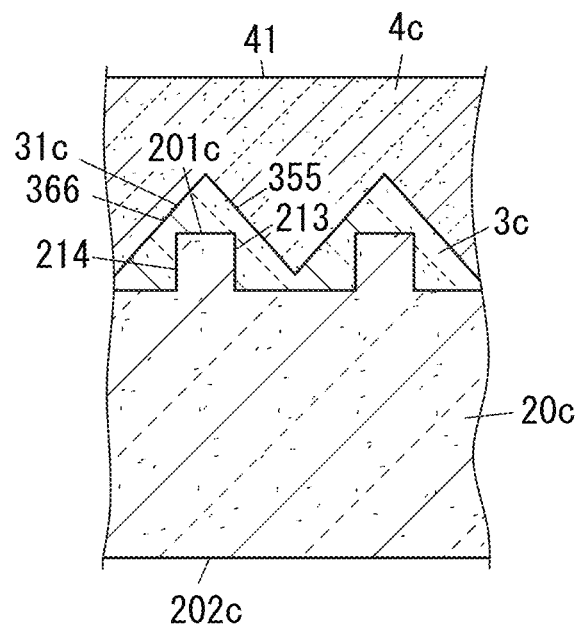

The third process step includes crystal-growing a Group II-IV nitride semiconductor portion 4c including a ZnGeN$_2$ crystal on the Group III nitride semiconductor portion 3c (see FIG. 16C). The third process step includes sequentially performing a first step and a second step. The first step includes supplying ammonia and a source material of Zn (such as dimethyl zinc) into the reactor and causing a Zn atom to be adsorbed onto the first surface 355 and the second surface 366 of the Group III nitride semiconductor portion 3c, thereby covering the first surface 355 and the second surface 366 with the Zn atom. As a result, in ZnGeN$_2$, a surface in contact with the GaN crystal that forms the Group III nitride semiconductor portion 3c is determined by the Zn atom. The second step includes starting supplying, after the first step, the source material of Ge (such as tetramethyl germanium) into the reactor and continuously supplying the respective source materials into the reactor during a predetermined growth period. The third process step allows a ZnGeN$_2$ single crystal to be epitaxially grown by sequentially performing the first step and the second step. In this case, the ZnGeN$_2$ single crystal that has been grown epitaxially is the Group II-IV nitride semiconductor portion 4c. The principal surface 41 of the Group II-IV nitride semiconductor portion 4c is a (001) plane of the ZnGeN$_2$ single crystal. In the second step, it is important to control the crystal growing condition such that the growth rate of ZnGeN$_2$ in <001> directions is lower than the growth rate in any other direction. Examples of the specific control of the crystal growing condition include increasing the flow rate of ammonia, supplying only nitrogen gas as the carrier gas, increasing the proportion of a nitrogen gas in the carrier gas including the nitrogen gas and hydrogen gas, increasing the growth pressure, and increasing the molar flow rate of the source material of Zn compared to the molar flow rate of the source material of Ge to compensate for the Zn atom vaporized. Appropriately controlling the crystal growing condition allows a flat $ZnGeN_2$ single crystal, of which the principal surface 41 is a (001) plane, to be epitaxially grown.

Figure 17:
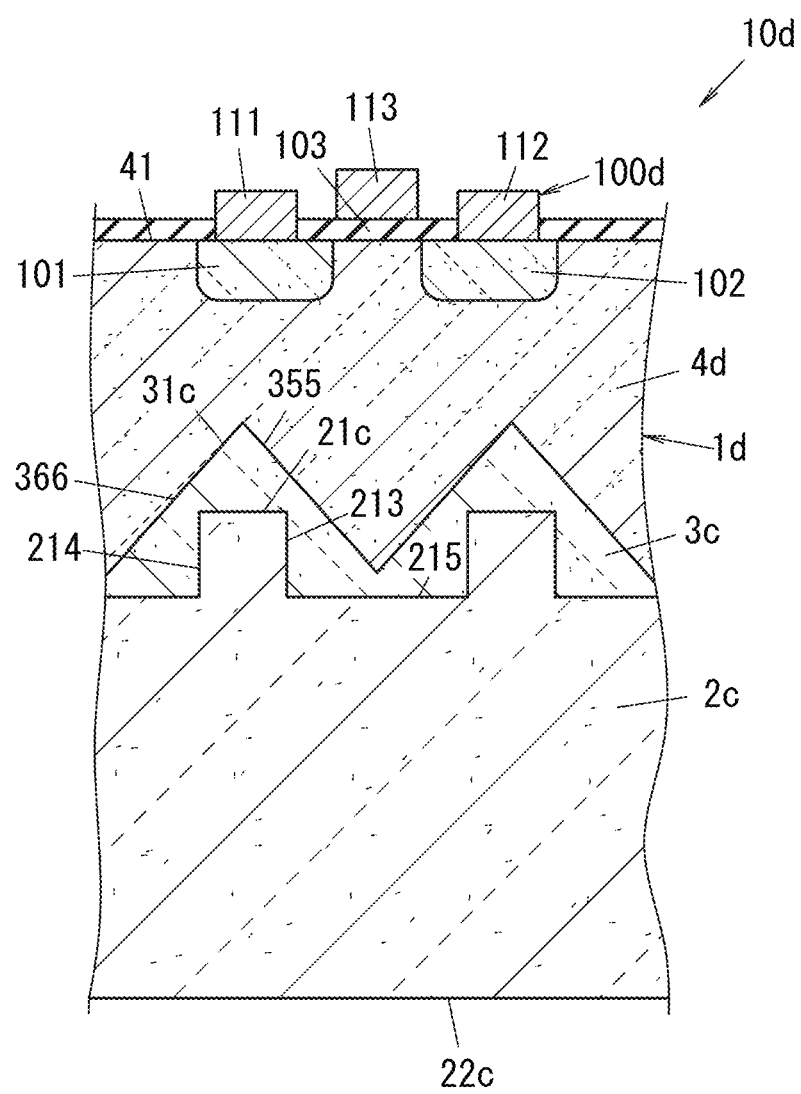
FIG. 17 is a cross-sectional view of a nitride semiconductor device according to the third embodiment.

Next, a nitride semiconductor device 10d, including a nitride semiconductor structure 1d similar to the nitride semiconductor structure 1c, will be described with reference to FIG. 17. In the following description, any constituent element of this nitride semiconductor structure 1d, having the same function as a counterpart of the nitride semiconductor structure 1c, will be designated by the same reference numeral as that counterpart's, and description thereof will be omitted herein.

The Group II-IV nitride semiconductor portion 4d is a p-type $ZnGeN_2$ single crystal. The nitride semiconductor device 10d includes the nitride semiconductor structure 1d. The nitride semiconductor device 10d includes a semiconductor element 100d including at least a part of the Group II-IV nitride semiconductor portion 4d.

The semiconductor element 100d may be, for example, a metal insulator semiconductor field effect transistor (MISFET). The semiconductor element 100d includes an n-type source region 101, an n-type drain region 102, a source electrode 111, a drain electrode 112, an insulating film 103, and a gate electrode 113. The n-type source region 101 and the n-type drain region 102 are defined in surface regions, adjacent to the principal surface 41, of the Group II-IV nitride semiconductor portion 4d. The source electrode 111 is formed over, and electrically connected to, the n-type source region 101. The drain electrode 112 is formed over, and electrically connected to, the n-type drain region 102. The insulating film 103 covers the principal surface 41 of the Group II-IV nitride semiconductor portion 4d entirely but its regions covered with the source electrode 111 and the drain electrode 112, respectively. The gate electrode 113 is formed on the insulating film 103. The n-type source region 101 and the n-type drain region 102 may be, for example, n-type $ZnGeN_2$ regions. Examples of materials for the source electrode 111 and the drain electrode 112 may include aluminum. The insulating film 103 may be, for example, a silicon nitride film. The insulating film 103 also serves as a gate insulating film. The insulating film 103 may have a thickness of 200 nm, for example. Examples of materials for the gate electrode 113 may include aluminum.

The nitride semiconductor device 10d described above includes the semiconductor element 100d including at least a part of the Group II-IV nitride semiconductor portion 4d of the nitride semiconductor structure 1d. This allows the nitride semiconductor device 10d to achieve a configuration in which the single-crystalline Group II-IV nitride semiconductor portion 4d is provided over the single-crystalline Group III nitride semiconductor portion 3c.

In addition, the nitride semiconductor device 10d includes an MISFET as the semiconductor element 100d, and therefore, may operate at higher temperatures than an Si-based transistor.

Next, a method for fabricating the nitride semiconductor device 10d will be described with reference to FIGS. 18A-19C. In the following description of the method for fabricating the nitride semiconductor device 10d, as for any process step, corresponding to a counterpart of the method for fabricating the nitride semiconductor structure 1c described above, description thereof will be omitted herein as appropriate.

The method for fabricating the nitride semiconductor device 10d includes the following first through sixth process steps.

Figure 18A:
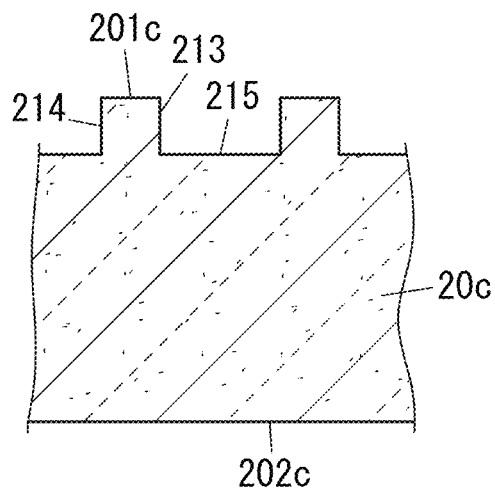
FIGS. 18A-18C are cross-sectional views illustrating respective process steps of a method for fabricating the nitride semiconductor device.

The first process step includes providing a Group III nitride semiconductor wafer 20c having a plurality of recesses 215 (see FIG. 18A).

Figure 18B:
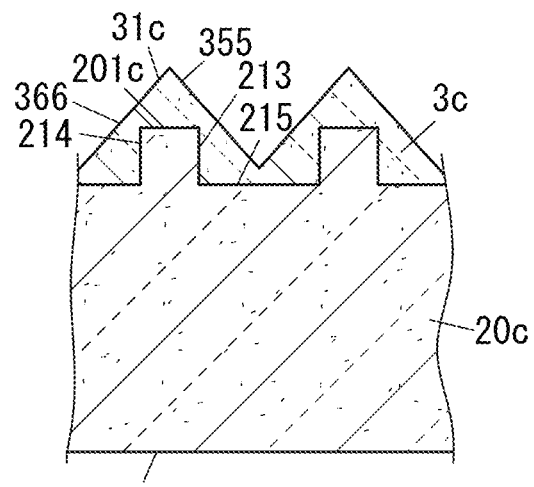

The second process step includes loading the Group III nitride semiconductor wafer 20c into a reactor of an MOCVD system and raising the temperature while supplying ammonia as a nitrogen source material thereto. When the temperature reaches a desired crystal growing temperature of the GaN crystal, a Ga source material (such as trimethyl gallium) starts to be supplied, thereby starting growing a GaN crystal on the first principal surface 201c, the first side surface 213, the second side surface 214, and the bottom surface of the recesses 215 of the Group III nitride semiconductor wafer 20c. In this second process step, a crystal growing condition for reducing the crystal growth from the first side surface 213 and the second side surface 214 is adopted. Adopting such a crystal growing condition allows a Group III nitride semiconductor portion 3c made up of a GaN crystal (GaN regrown layer) having a first surface 355 and a second surface 366 to be formed as shown in FIG. 18B. The first surface 355 is a (11-22) plane of the GaN crystal. The second surface 366 is a (-1-22) plane of the GaN crystal.

Figure 18C:
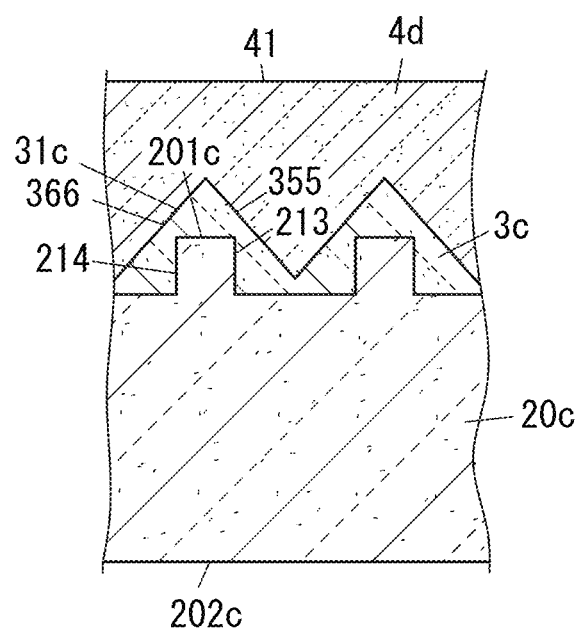

The third process step includes crystal-growing a Group II-IV nitride semiconductor portion 4d including a p-type $ZnGeN_2$ single crystal on the Group III nitride semiconductor portion 3c (see FIG. 18C). The third process step includes sequentially performing a first step and a second step. The first step includes supplying ammonia and a source material of Zn (such as dimethyl zinc) into the reactor and causing a Zn atom to be adsorbed onto the first surface 355 and the second surface 366 of the Group III nitride semiconductor portion 3c, thereby covering the first surface 355 and the second surface 366 with the Zn atom. As a result, in the p-type $ZnGeN_2$ single crystal, a surface in contact with the GaN crystal that forms the Group III nitride semiconductor portion 3c is determined by the Zn atom. The second step includes starting supplying, after the first step, the source material of Ge (such as tetramethyl germanium) into the reactor and continuously supplying the respective source materials into the reactor during a predetermined growth period. The third process step allows a p-type $ZnGeN_2$ single crystal to be epitaxially grown by sequentially performing the first step and the second step. In this case, the p-type $ZnGeN_2$ single crystal that has been grown epitaxially is the Group II-IV nitride semiconductor portion 4d. The principal surface (uppermost surface) 41 of the Group II-IV nitride semiconductor portion 4d is a (001) plane of the p-type $ZnGeN_2$ single crystal.

Figure 19A:
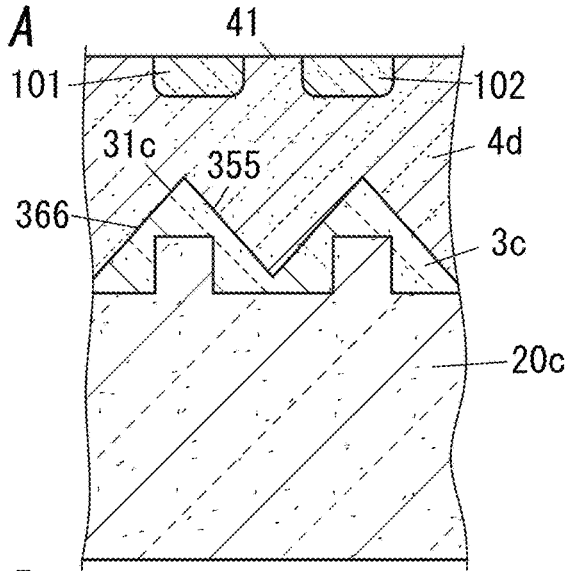
FIGS. 19A-19C are cross-sectional views illustrating respective process steps of the method for fabricating the nitride semiconductor device.

The fourth process step includes implanting ions of an n-type dopant into respective regions, which will define the n-type source region 101 and the n-type drain region 102, of the Group II-IV nitride semiconductor portion 4d and then performing an annealing treatment, thereby forming the n-type source region 101 and the n-type drain region 102 (see FIG. 19A). A donor element, serving as the n-type dopant, is suitably a Group III element such as aluminum or gallium when the donor element is going to replace a Group II site. The donor element is suitably a Group V element such as arsenic or phosphorus when the donor element is going to replace a Group IV site. The donor element is suitably a Group VI element such as oxygen when the donor element is going to replace a nitrogen site. Among these options, to turn the conductivity type of those regions into n-type by ion implantation, oxygen, having little difference in atomic radius from a nitrogen atom, is most suitable. The annealing condition of the annealing treatment includes setting the pressure of the atmosphere at ordinary pressure, using a nitrogen gas atmosphere, setting the annealing temperature at 800° C., and setting the annealing time at two hours.

Figure 19B:
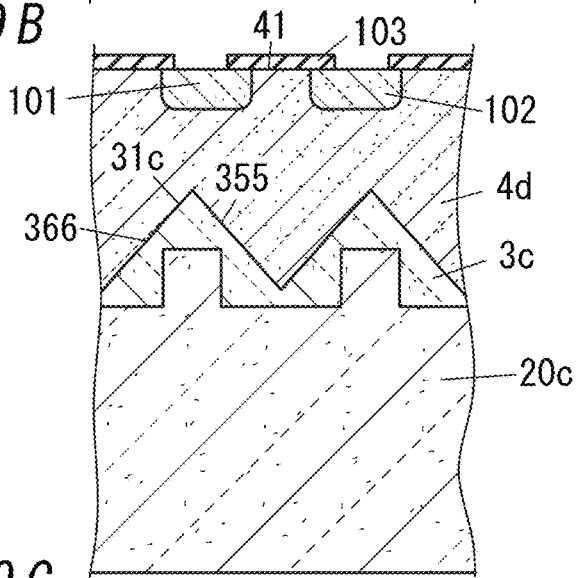

The fifth process step includes forming an insulating film 103 having a predetermined pattern on the principal surface 41 of the Group II-IV nitride semiconductor portion 4d (see FIG. 19B). In this case, in the fifth process step, after a silicon nitride film to be the insulating film 103 has been formed by plasma CVD process on the principal surface 41 of the Group II-IV nitride semiconductor portion 4d, the silicon nitride film is patterned by photolithographic and etching techniques, thereby forming the insulating film 103 out of a part of the silicon nitride film. Note that as an etchant for use to etch the silicon nitride film, an etchant containing hydrofluoric acid may be used, for example.

Figure 19C:
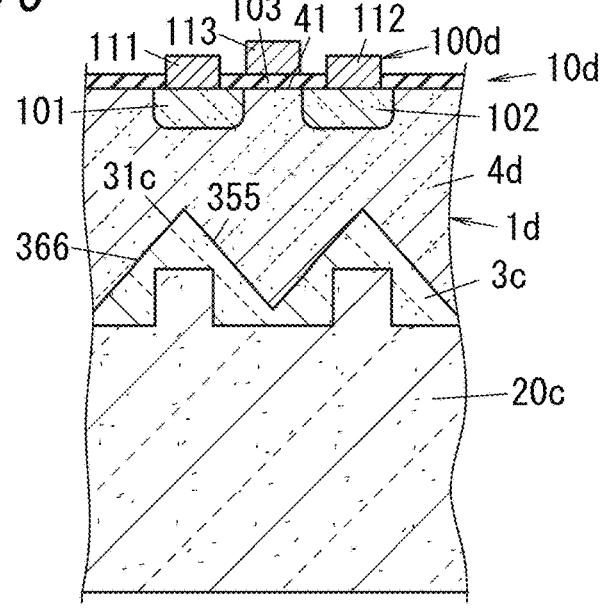

The sixth process step includes forming the source electrode 111, the drain electrode 112, and the gate electrode 113 by evaporation process, for example (see FIG. 19C). As a result, a nitride semiconductor device 10d including the semiconductor element 100d is formed.

The method for fabricating the nitride semiconductor device 10d described above includes epitaxially growing, on a predetermined crystallographic plane other than a (0001) plane of the single-crystalline Group III nitride semiconductor portion 3c containing a Group III element, a single-crystalline Group II-IV nitride semiconductor portion 4d containing a Group II element and a Group IV element (i.e., includes the third process step described above). Thus, the method for fabricating the nitride semiconductor device 10d may provide a configuration in which the single-crystalline Group II-IV nitride semiconductor portion 4d is provided over the single-crystalline Group III nitride semiconductor portion 3c.

Optionally, before the Group II-IV nitride semiconductor portion 4d is epitaxially grown on the predetermined crystallographic plane of the Group III nitride semiconductor portion 3c, a device structure for a power transistor may be formed on the Group III nitride semiconductor portion 3c and a logic circuit may be formed on the Group II-IV nitride semiconductor portion 4d that has been crystal-grown thereon. Then, a power control device that may operate at high temperatures may also be provided.

Fourth Embodiment

Figure 20:
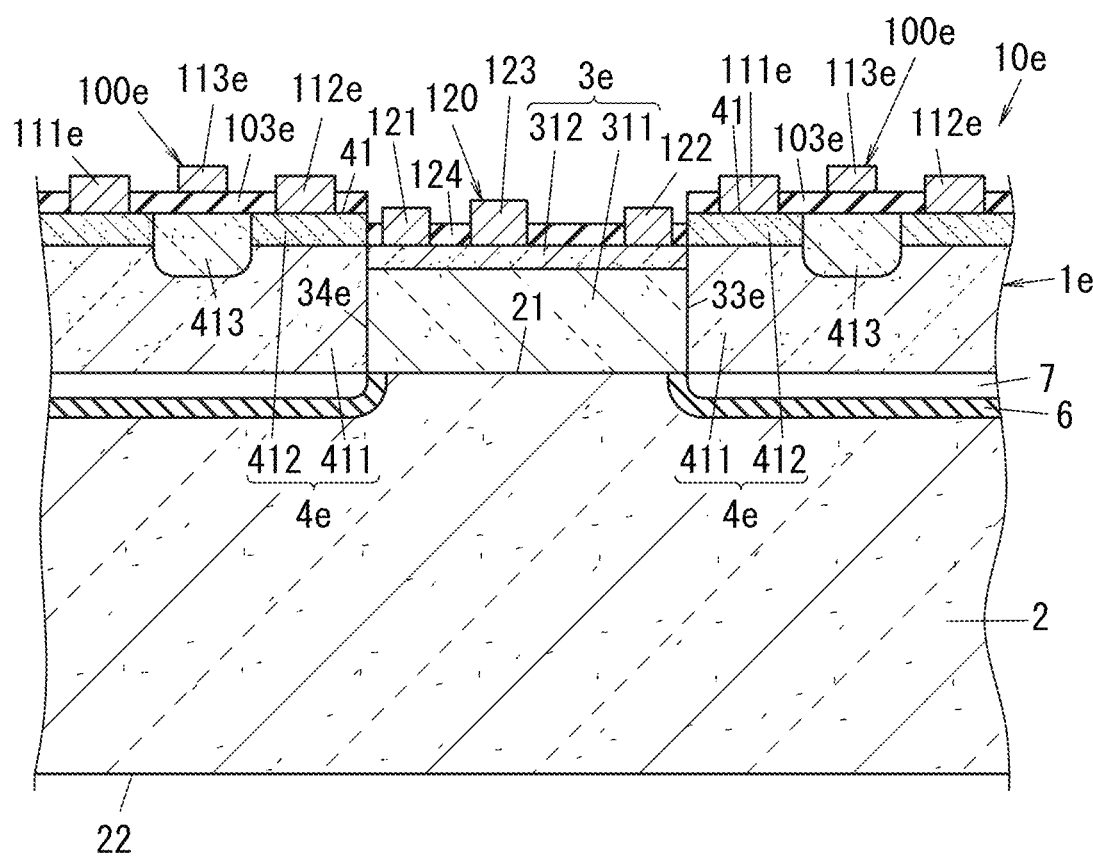
FIG. 20 is a cross-sectional view of a nitride semiconductor device according to a fourth embodiment.

Next, a nitride semiconductor device 10e including a nitride semiconductor structure 1e according to a fourth embodiment will be described with reference to FIG. 20. In the following description, any constituent element of the nitride semiconductor device 10e according to this fourth embodiment, having the same function as a counterpart of the nitride semiconductor device 10 according to the first embodiment described above, will be designated by the same reference numeral as that counterpart's, and description thereof will be omitted herein as appropriate.

The nitride semiconductor structure 1e includes a Group III nitride semiconductor portion 3e and a Group II-IV nitride semiconductor portion 4e instead of the Group III nitride semiconductor portion 3 and the Group II-IV nitride semiconductor portion 4 of the nitride semiconductor structure 1 according to the first embodiment. In the following description, any constituent element of the Group III nitride semiconductor portion 3e and the Group II-IV nitride semiconductor portion 4e, having the same function as a counterpart of the Group III nitride semiconductor portion 3 and the Group II-IV nitride semiconductor portion 4 described above, will be designated by the same reference numeral as that counterpart's, and description thereof will be omitted as appropriate herein.

The Group II-IV nitride semiconductor portion 4e is provided on a first side surface 33e and a second side surface 34e of the Group III nitride semiconductor portion 3e. The first side surface 33e is the predetermined crystallographic plane. The Group II-IV nitride semiconductor portion 4e is single crystalline. The Group II-IV nitride semiconductor portion 4e forms a heterojunction with the Group III nitride semiconductor portion 3e. The predetermined crystallographic plane is a crystallographic plane other than a (0001) plane.

The nitride semiconductor device 10e includes a semiconductor element 100e including at least a part of the Group II-IV nitride semiconductor portion 4e (hereinafter also referred to as a "first semiconductor element 100e"). The nitride semiconductor device 10e further includes, separately from the first semiconductor element 100e, a second semiconductor element 120 formed on the Group III nitride semiconductor portion 3e.

The Group III nitride semiconductor portion 3e has a multilayer structure including a plurality of (e.g., two in this example) Group III nitride semiconductor layers having mutually different compositions. More specifically, the Group III nitride semiconductor portion 3e has a multilayer structure including a first Group III nitride semiconductor layer 311 formed on the first principal surface 21 of the single-crystalline silicon substrate 2 and a second Group III nitride semiconductor layer 312 formed on the first Group III nitride semiconductor layer 311. The first Group III nitride semiconductor layer 311 may be a GaN layer, for example. The second Group III nitride semiconductor layer 312 may be, for example, an $Al_xGa_{1-x}N$ layer, where $0<x<1$. The Al composition ratio x may be 0.25, for example. The $Al_xGa_{1-x}N$ layer may have a thickness of 25 nm, for example. The second Group III nitride semiconductor layer 312 has a larger bandgap than the first Group III nitride semiconductor layer 311. The Group III nitride semiconductor portion 3e has a heterojunction between the first Group III nitride semiconductor layer 311 and the second Group III nitride semiconductor layer 312.

The first side surface 33e of the Group III nitride semiconductor portion 3e includes an a-plane of the GaN crystal (i.e., a (11-22) plane) and an a-plane of the $Al_xGa_{1-x}N$ crystal (i.e., a (11-22) plane). The second side surface 34e of the Group III nitride semiconductor portion 3e includes a (-1-120) plane of the GaN crystal and a (-1-120) plane of the $Al_xGa_{1-x}N$ crystal.

The Group II-IV nitride semiconductor portion 4e has a multilayer structure including an n-type $ZnGeN_2$ layer 411 and a p-type $ZnGeN_2$ layer 412 stacked on the n-type $ZnGeN_2$ layer 411. The dopant introduced into the p-type $ZnGeN_2$ layer 412 may be aluminum, for example. The dopant introduced into the n-type $ZnGeN_2$ layer 411 may be arsenic. The n-type $ZnGeN_2$ layer 411 may also be formed even without being doped with any dopant such as arsenic. When viewed in plan along the thickness of the Group III nitride semiconductor portion 3e, the n-type $ZnGeN_2$ layer 411 is arranged beside the Group III nitride semiconductor portion 3e. The Group III nitride semiconductor portion 3e and the n-type ZnGeN$_2$ layer 411 are arranged side by side on a cross section taken along a plane aligned with the thickness of the Group III nitride semiconductor portion 3e. In this case, the Group III nitride semiconductor portion 3e and the n-type ZnGeN$_2$ layer 411 are arranged side by side in a direction aligned with the crystal axis [11-20] direction of the first Group III nitride semiconductor layer 311 and the crystal axis [11-20] direction of the second Group III nitride semiconductor layer 312. The thickness of the n-type ZnGeN$_2$ layer 411 is approximately equal to the thickness of the Group III nitride semiconductor portion 3e. The thickness of the p-type ZnGeN$_2$ layer 412 is less than the thickness of the n-type ZnGeN$_2$ layer 411. The p-type ZnGeN$_2$ layer 412 may have a thickness of 200 nm, for example. The principal surface 41 of the Group II-IV nitride semiconductor portion 4e is a c-plane of the ZnGeN$_2$ single crystal.

The second semiconductor element 120 may be, for example, an n-channel metal semiconductor field effect transistor (MESFET). The second semiconductor element 120 is formed on the Group III nitride semiconductor portion 3e, as described above. In this case, in the Group III nitride semiconductor portion 3e, a two-dimensional electron gas has been generated in the vicinity of the heterojunction between the first Group III nitride semiconductor layer 311 and the second Group III nitride semiconductor layer 312. A region including the two-dimensional electron gas (hereinafter sometimes referred to as a "two-dimensional electron gas layer") may serve as an n-channel layer (electron conduction layer). The first Group III nitride semiconductor layer 311 may be, but does not have to be, a GaN layer. Alternatively, the first Group III nitride semiconductor layer 311 may also have a multilayer structure of any other Group III nitride semiconductor, for example. In that case, the first Group III nitride semiconductor layer 311 allows the strain distribution within the film and the density of feedthrough dislocations to be controlled freely, thus enabling increasing the thickness of the first Group III nitride semiconductor layer 311 and decreasing the density of dislocations in the surface region of the first Group III nitride semiconductor layer 311.

The second semiconductor element 120 includes a source electrode 121, a drain electrode 122, and a gate electrode 123. The source electrode 121, the drain electrode 122, and the gate electrode 123 are formed on the principal surface of the second Group III nitride semiconductor layer 312. The principal surface of the second Group III nitride semiconductor layer 312 is a surface, opposite from the other surface in contact with the first Group III nitride semiconductor layer 311, of the second Group III nitride semiconductor layer 312. In the second semiconductor element 120, the source electrode 121 and the drain electrode 122 are spaced from each other on the principal surface of the second Group III nitride semiconductor layer 312. In addition, in the second semiconductor element 120, the gate electrode 123 is located between the source electrode 121 and the drain electrode 122 on the principal surface of the second Group III nitride semiconductor layer 312. Examples of materials for the source electrode 121 and the drain electrode 122 include titanium. A material for the gate electrode 123 may be, for example, a metal with a great work function and includes nickel or palladium. The metal as a constituent material for the gate electrode 123 has a different work function from the Al$_x$Ga$_{1-x}$N crystal that forms the second Group III nitride semiconductor layer 312, and therefore, raises the band of the Al$_x$Ga$_{1-x}$N crystal toward a high energy range. This eliminates the two-dimensional electron gas from right under the gate electrode 123, thus realizing a normally-off state.

The first semiconductor element 100e may be a p-channel MISFET, for example. The first semiconductor element 100e includes an n-type ZnGeN$_2$ region 413, a source electrode 111e, a drain electrode 112e, an insulating film 103e, and a gate electrode 113e. The n-type ZnGeN$_2$ region 413 is formed in a surface region, adjacent to the principal surface 41, of the Group II-IV nitride semiconductor portion 4e. The n-type ZnGeN$_2$ region 413 is formed to extended through the p-type ZnGeN$_2$ layer 412 and reach the n-type ZnGeN$_2$ layer 411. The source electrode 111e and the drain electrode 112e are formed on the p-type ZnGeN$_2$ layer 412. The insulating film 103e covers the entire principal surface 41 of the p-type ZnGeN$_2$ layer 412 but the regions covered with the source electrode 111e and the drain electrode 112e. The gate electrode 113e is formed on the insulating film 103e. In the first semiconductor element 100e, when viewed in plan along the thickness of the first semiconductor element 100e, the gate electrode 113e is located between the source electrode 111e and the drain electrode 112e and overlaps with the n-type ZnGeN$_2$ region 413. Examples of materials for the source electrode 111e and the drain electrode 112e include nickel. The insulating film 103e may be a silicon nitride film, for example. The insulating film 103e also serves as a gate insulating film. The insulating film 103e may have a thickness of 200 nm, for example. A material for the gate electrode 113e may include, for example, aluminum.

Next, a method for fabricating the nitride semiconductor device 10e will be described with reference to FIGS. 21A-23C. In the following description, as for any process step, corresponding to a counterpart of the method for fabricating the nitride semiconductor structure 1 according to the first embodiment described above, description thereof will be omitted herein as appropriate.

The method for fabricating the nitride semiconductor device 10e includes at least the following first through twelfth process steps.

The first process step includes providing a single-crystalline silicon wafer 20 (see FIG. 21A) that forms the basis of the single-crystalline silicon substrate 2. The single-crystalline silicon substrate 2 has a first principal surface 21 and a second principal surface 22. The single-crystalline silicon wafer 20 has a first principal surface 201 and a second principal surface 202 respectively corresponding to the first principal surface 21 and the second principal surface 22 of the single-crystalline silicon substrate 2. In this case, the first principal surface 201 of the single-crystalline silicon wafer 20 is a (111) plane.

The second process step includes crystal-growing, by MOCVD process, a Group III nitride semiconductor layer 303e (see FIG. 21A), which will be a Group III nitride semiconductor portion 3e, on the first principal surface 201 of the single-crystalline silicon wafer 20. In this case, the Group III nitride semiconductor layer 303e has a multilayer structure including a first Group III nitride semiconductor layer 3301 on the first principal surface 201 of the single-crystalline silicon wafer 20 and a second Group III nitride semiconductor layer 3302 on the first Group III nitride semiconductor layer 3301. The first Group III nitride semiconductor layer 3301 is a single-crystalline GaN layer. The second Group III nitride semiconductor layer 3302 is a single-crystalline layer. The principal surface 3331 of the Group III nitride semiconductor layer 303e is a c-plane, i.e., a (0001) plane. As Ga and N source materials for crystal-growing the first Group III nitride semiconductor layer 3301, TMGa (trimethyl gallium) and NH₃ (ammonia) may be respectively used. As Al, Ga, and N source materials for crystal-growing the second Group III nitride semiconductor layer 3302, TMAl (trimethyl aluminum), TMGa, and NH₃ may be respectively used.

The third process step includes depositing a silicon dioxide film 50 (see FIG. 21A) on the principal surface 3331 of the Group III nitride semiconductor layer 303e.

Figure 21A:
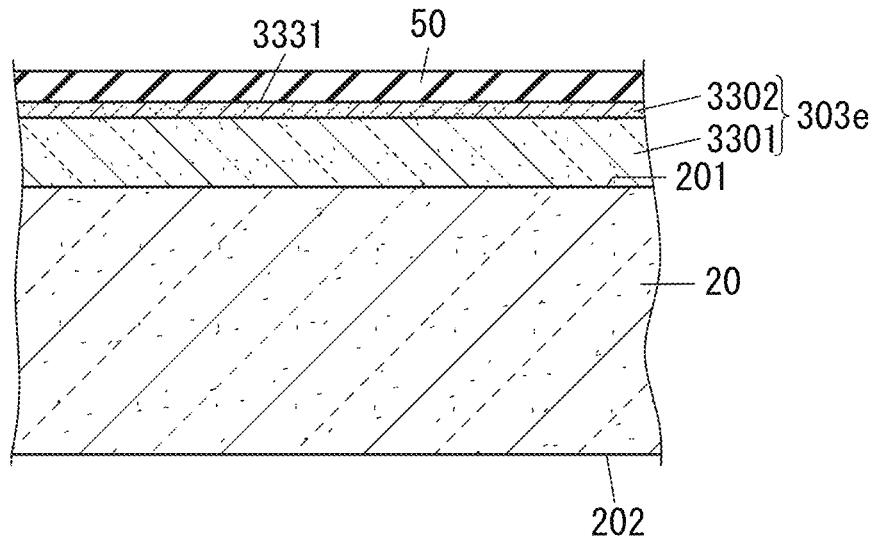
FIGS. 21A-21C are cross-sectional views illustrating respective process steps of a method for fabricating the nitride semiconductor device.
Figure 21B:
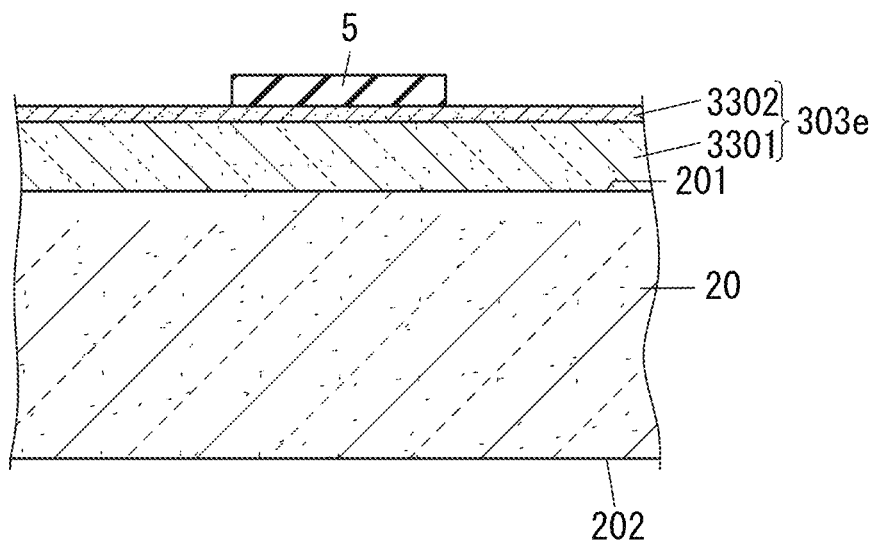

The fourth process step includes patterning the silicon dioxide film 50 by photolithographic and etching techniques, thereby forming a plurality of silicon dioxide portions 5, each of which formed part of the silicon dioxide film 50 (see FIG. 21B). In FIG. 21B, only one of the plurality of silicon dioxide portions 5 is shown. Each of the plurality of silicon dioxide portions 5 has a straight shape when viewed along the thickness of the single-crystalline silicon wafer 20. The plurality of silicon dioxide portions 5 are arranged in stripes on the principal surface 3331 of the Group III nitride semiconductor layer 303e. The longitudinal axis of the plurality of silicon dioxide portions 5 is aligned with the crystal axis [1-100] direction of the first Group III nitride semiconductor layer 3301 and the crystal axis [1-100] direction of the second Group III nitride semiconductor layer 3302. The latitudinal axis (i.e., width) of the plurality of silicon dioxide portions 5 is aligned with the crystal axis [11-20] direction of the first Group III nitride semiconductor layer 3301 and the crystal axis [11-20] direction of the second Group III nitride semiconductor layer 3302.

Figure 21C:
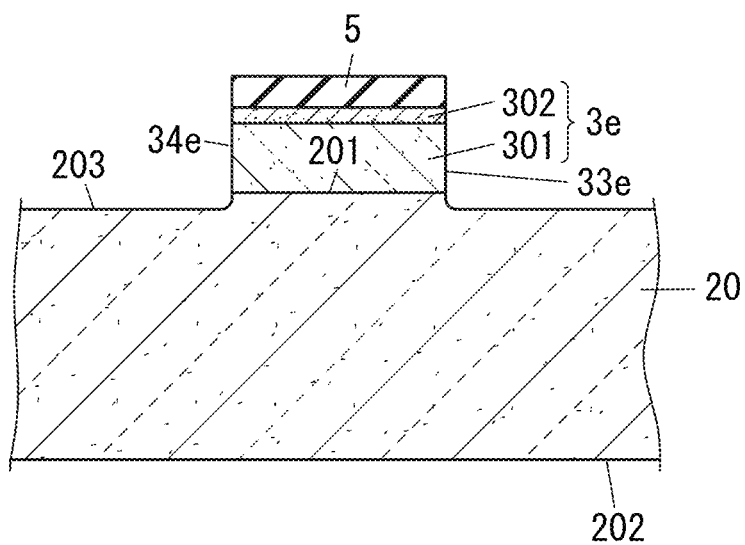

The fifth process step includes patterning the Group III nitride semiconductor layer 303e to form a plurality of Group III nitride semiconductor portions 3e, each of which formed part of the Group III nitride semiconductor layer 303e (see FIG. 21C). The fifth process step includes a first step of dry-etching the Group III nitride semiconductor layer 303e using the plurality of silicon dioxide portions 5 as a mask and a second step of performing, after the first step, an annealing treatment to remove the damage caused by the etching process. In each of the plurality of Group III nitride semiconductor portions 3e formed by performing the fifth step, the first side surface 33e thereof includes an a-plane of the GaN crystal, i.e., a (11-22) plane, and an a-plane of the Al$_x$Ga$_{1-x}$N crystal, i.e., a (11-22) plane. The second side surface 34e of each of the plurality of Group III nitride semiconductor portions 3e includes a (-1-120) plane of the GaN crystal and a (-1-120) plane of the AlGaN crystal. In the first step of the fifth process step, a chlorine-based gas is used as etch gas for dry-etching the Group III nitride semiconductor layer 303e. However, this is only an example and should not be construed as limiting. Alternatively, an argon gas may also be used, for example. In addition, the first step of the fifth process step includes dry-etching the Group III nitride semiconductor layer 303e using the plurality of silicon dioxide portions 5 as a mask and then dry-etching the single-crystalline silicon wafer 20 to a predetermined depth as well. In the second step of the fifth process step, the annealing condition of the annealing treatment includes, for example, defining a pressure of the atmosphere at ordinary pressure, the atmosphere to be a nitrogen gas atmosphere, the annealing temperature at 700° C., and the annealing duration at one hour, for example.

Figure 22A:
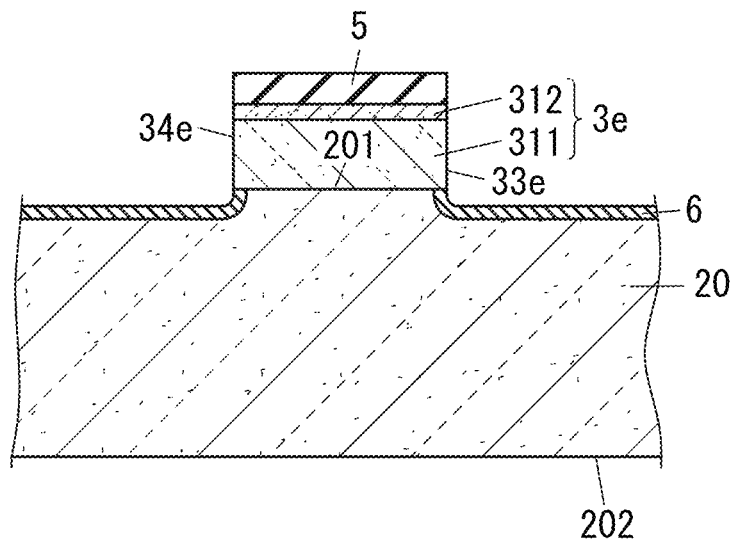
FIGS. 22A-22C are cross-sectional views illustrating respective process steps of the method for fabricating the nitride semiconductor device.
Figure 22B:
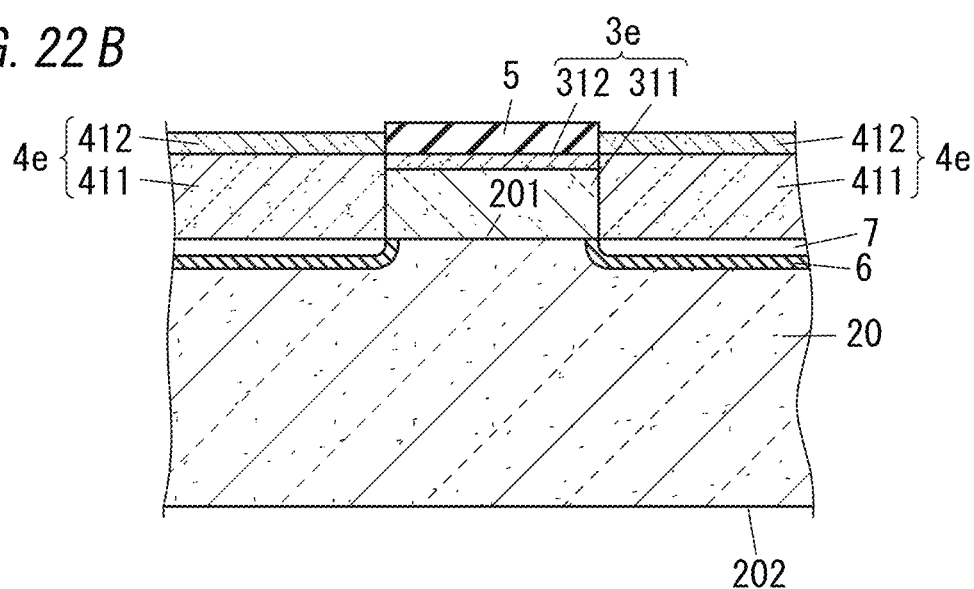

The sixth process step includes nitrifying the exposed surface 203 (see FIG. 21C) of the single-crystalline silicon wafer 20 to form a silicon nitride film 6 (see FIG. 22A). In the sixth process step, first, a wafer including the single-crystalline silicon wafer 20 and the plurality of Group III nitride semiconductor portions 3e is loaded into the reactor of an MOCVD system and placed at a predetermined position therein. Thereafter, with NH₃ supplied into the reactor, the temperature of the wafer is raised to a temperature higher than 400° C. to nitrify the exposed surface 203 of the single-crystalline silicon wafer 20 and thereby form the silicon nitride film 6.

The seventh process step includes crystal-growing a Group II-IV nitride semiconductor portion 4e (see FIG. 22B) by sequentially performing a first step and a second step. The first step includes crystal-growing an n-type ZnGeN₂ layer 411 of the Group II-IV nitride semiconductor portion 4e on a predetermined crystallographic plane of the Group III nitride semiconductor portion 3e in the reactor of an MOCVD system. The second step includes crystal-growing a p-type ZnGeN₂ layer 412 on the principal surface of the n-type ZnGeN₂ layer 411 in the reactor of the MOCVD system. The crystal growth in the first step may be carried out by appropriately adjusting the flow rates (molar flow rates) of respective source materials. For example, first, the crystal growth may be started with the flow rate of ammonia as an N source material made 20 times or more higher than the flow rate of a Zn source material (such as diethyl zinc) and the flow rate of a Ge source material (such as tetraethyl germanium). Alternatively, the crystal growth may also be started with the ratio of a hydrogen gas decreased and the ratio of a nitrogen gas increased in a carrier gas including the hydrogen gas and the nitrogen gas. In this case, the flow rate of the zinc source material needs to be higher than the flow rate of the germanium source material. This is important to reduce the number of rotary domains produced in the n-type ZnGeN₂ layer 411. The crystal growth of the n-type ZnGeN₂ layer 411 in the first step is lateral growth of the crystal that preferentially grows laterally from the first side surface 33e and second side surface 34e of the Group III nitride semiconductor portion 3e. In the first step, not only diethyl zinc, tetraethyl germanium, and ammonia respectively used as Zn, Ge, and N source materials but also arsine or an organic arsenic compound (such as trimethyl arsenic or triethyl arsenic) as a source material of As introduced as a dopant are supplied into the reactor. The n-type ZnGeN₂ layer 411 may be grown even if no dopant source material is supplied during the growing process. In the second step, the crystal growth is started with either the flow rate of ammonia or the ratio of the nitrogen gas in the carrier gas decreased. The crystal growth of the p-type ZnGeN₂ layer in the second step is vertical growth of the crystal that preferentially grows vertically along the thickness of the n-type ZnGeN₂ layer 411. In the second step, not only diethyl zinc, tetraethyl germanium, and ammonia respectively used as Zn, Ge, and N source materials but also TMAl as a source material of Al introduced as a dopant are supplied into the reactor as well. In the second step, the molar flow rate of the Ge source material is set at a smaller value than the molar flow rate of the Zn source material, thus allowing Al added as a dopant to be preferentially introduced into Ge sites and serve as an acceptor. Note that in the seventh process step, no ZnGeN₂ crystals grow on any of the plurality of silicon dioxide portions 5. That is to say, the plurality of silicon dioxide portions 5 has the function of serving as a mask for selective growth. In addition, the silicon dioxide portions 5 also have the function of serving as a protective coating and may prevent Zn, Ge, and other constituent elements of the Group II-IV nitride semiconductor portion 4e from diffusing into the Group III nitride semiconductor portion 3e.

Figure 22C:
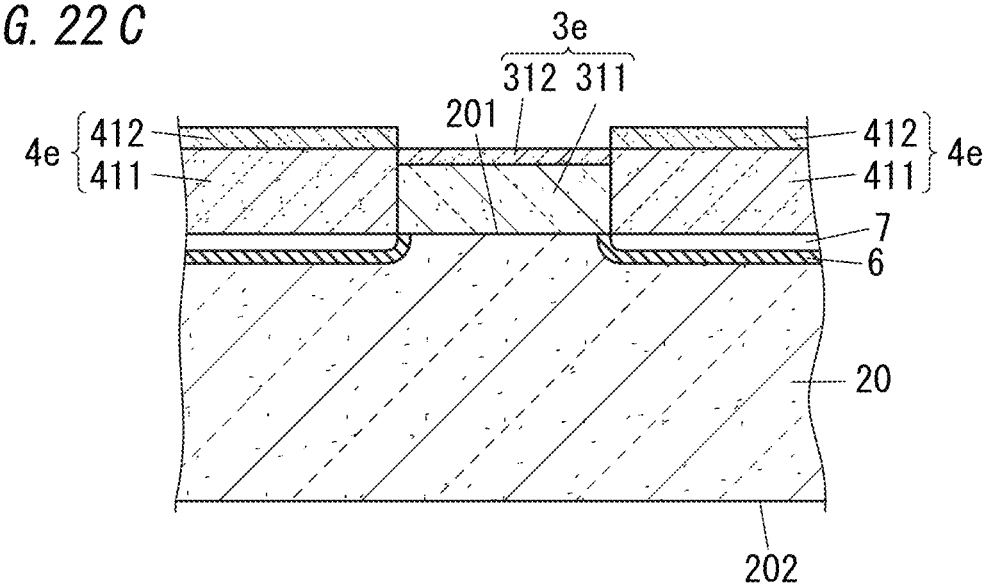

The eighth process step includes etching away the plurality of silicon dioxide portions 5 (see FIG. 22C). In the eighth process step, hydrofluoric acid, for example, may be used as an etchant.

Figure 23A:
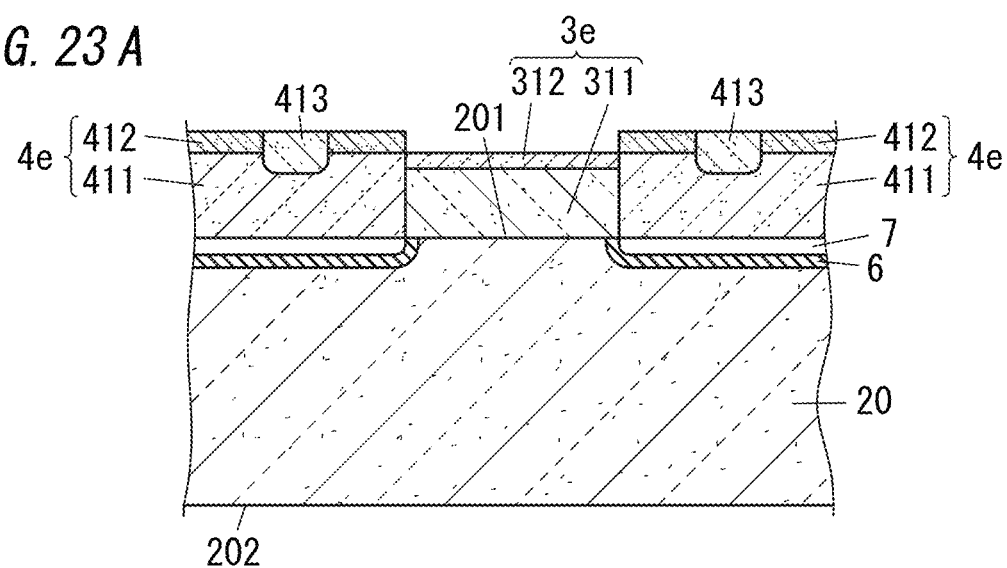
FIGS. 23A-23C are cross-sectional views illustrating respective process steps of the method for fabricating the nitride semiconductor device.

The ninth process step includes forming an n-type ZnGeN$_2$ region 413 in each Group II-IV nitride semiconductor portion 4e by using a photolithographic technique, an ion implantation technique, and annealing treatment, for example (see FIG. 23A). If the donor element is intended to replace a Group II site (Zn site) of ZnGeN$_2$, then a Group III element such as aluminum or gallium is preferably used as the donor element. If the donor element is intended to replace a Group IV site (Ge site) of ZnGeN$_2$, then a Group V element such as arsenic or phosphorus is preferably used as the donor element. If the donor element is intended to replace the N site of ZnGeN$_2$, then a Group VI element such as oxygen is preferably used as the donor element. To turn the conductivity type into n-type by ion implantation, oxygen, having an atomic radius closer to the atomic radius of the nitrogen than any other one of these materials of aluminum, gallium, arsenic, phosphorus, and oxygen, is most suitable. The annealing condition of the annealing treatment may be defined by, for example, setting the pressure of the atmosphere at ordinary pressure, using a nitrogen gas atmosphere as the atmosphere, setting the annealing temperature at 800° C., and setting the annealing time at 2 hours. The n-type ZnGeN$_2$ region 413 is formed to extend from the principal surface of the p-type ZnGeN$_2$ layer 412 through a depth level even deeper than the surface of the n-type ZnGeN$_2$ layer 411.

Figure 23B:
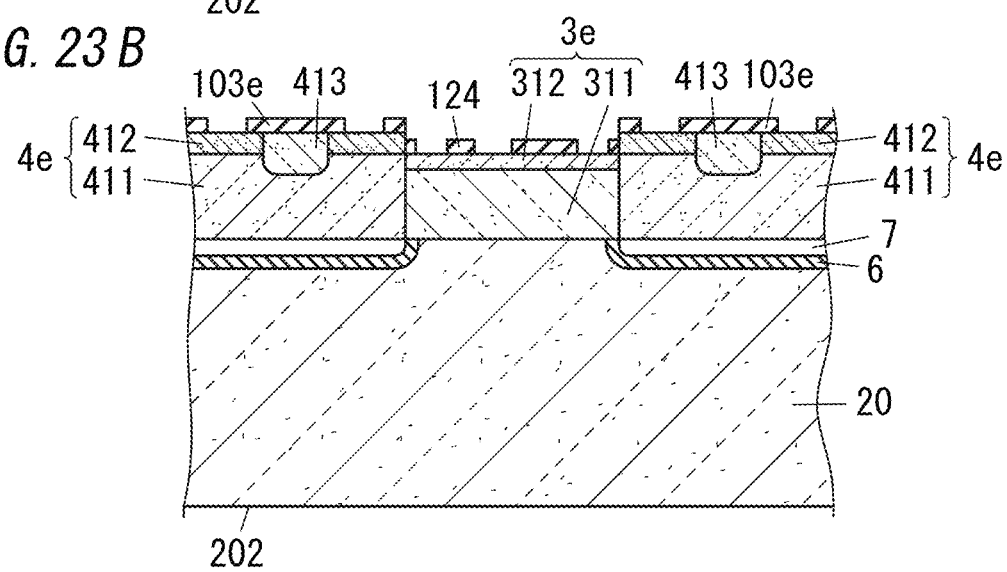

The tenth process step includes forming, by plasma CVD process, for example, a silicon nitride film to be respective insulating films 103e and respective insulating films 124 and then patterning the silicon nitride film by photolithographic and etching techniques, thereby forming the respective insulating films 103e and the respective insulating films 124, each of which formed part of the silicon nitride film (see FIG. 23B). To etch the silicon nitride film, hydrofluoric acid may be used, for example. In the tenth process step, the silicon nitride film is patterned to expose respective regions, where the source electrode 111e and drain electrode 112e of the first semiconductor element 100e are to be formed, of the principal surface 41 of the Group II-IV nitride semiconductor portion 4e and respective regions, where the source electrode 121, the drain electrode 122, and the gate electrode 123 of the second semiconductor element 120 are to be formed, of the principal surface of the Group III nitride semiconductor portion 3e.

Figure 23C:
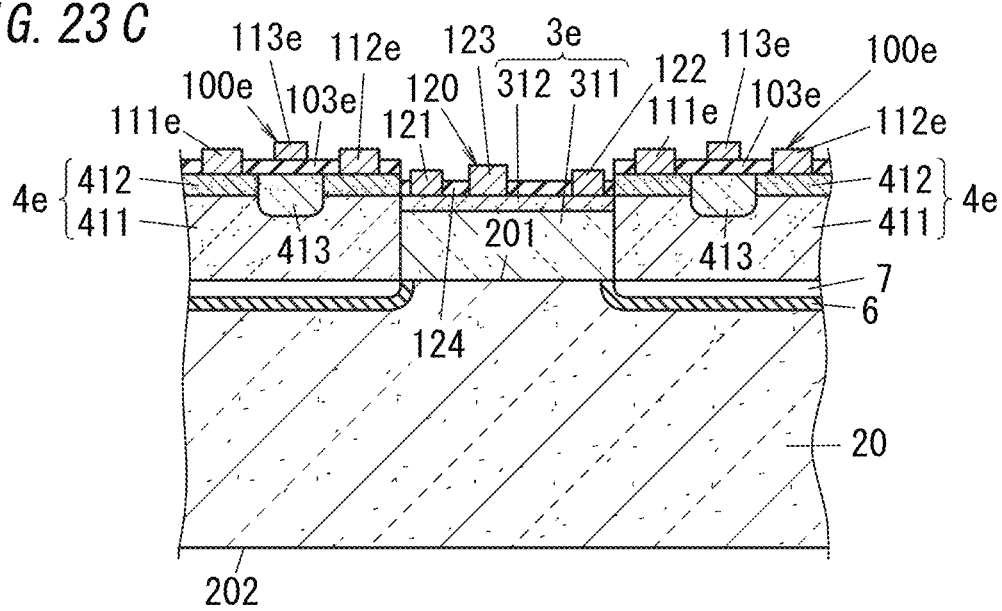

The eleventh process step includes forming the source electrode 111e, drain electrode 112e, and gate electrode 113e of the first semiconductor element 100e and the source electrode 121, drain electrode 122, and gate electrode 123 of the second semiconductor element 120 by evaporation process, for example (see FIG. 23C). The material for each of the source electrode 111e and drain electrode 112e of the first semiconductor element 100e is nickel. The material for the gate electrode 123 of the first semiconductor element 100e is aluminum. The material for each of the source electrode 121 and drain electrode 122 of the second semiconductor element 120 is titanium. The material for the gate electrode 123 of the second semiconductor element 120 may be nickel or palladium, for example.

The twelfth process step includes performing dicing to obtain a plurality of nitride semiconductor devices 10e.

In the nitride semiconductor device 10e according to the fourth embodiment described above, a p-channel MISFET is formed as the first semiconductor element 100e on the Group II-IV nitride semiconductor portion 4e and an n-channel MESFET is formed as the second semiconductor element 120 on the Group III nitride semiconductor portion 3e. It is difficult to fabricate a p-channel transistor using only a Group III nitride semiconductor. In the nitride semiconductor device 10e according to the fourth embodiment, a p-channel transistor may be formed on the Group II-IV nitride semiconductor portion 4e which has as wide a bandgap as the Group III nitride semiconductor, and which may operate with good stability at a high temperature. In addition, in the nitride semiconductor device 10e according to the fourth embodiment, any of various logic gates may also be implemented by forming appropriate wiring. Furthermore, according to the fourth embodiment, a power transistor that uses a Group III nitride semiconductor and a driver circuit with the ability to operate at high temperatures may also be monolithic integrated.

In the nitride semiconductor device 10e according to the fourth embodiment, a p-channel MISFET is formed on each of the two Group II-IV nitride semiconductor portions 4e located on both sides of the Group III nitride semiconductor portion 3e in the width direction. However, this is only an example and should not be construed as limiting. Alternatively, an MISFET may be provided on only one of the two Group II-IV nitride semiconductor portions 4e located on both sides of the Group III nitride semiconductor portion 3e in the width direction, and a diode, a resistor, and other components may be provided on the other Group II-IV nitride semiconductor portion 4e. The nitride semiconductor device 10e including the nitride semiconductor structure 1e allows electronic circuits and elements that may operate at higher temperatures than a silicon device to be laid out with an increased degree of freedom.

In addition, in the nitride semiconductor device 10e according to the fourth embodiment, an MESFET is formed as the second semiconductor element 120 on the Group III nitride semiconductor portion 3e. However, the second semiconductor element 120 is not an essential component. Also, the second semiconductor element 120 does not have to be an MESFET but may also be any other type of semiconductor element. Examples of other types of semiconductor elements include a vertical transistor, a gate injection transistor, a bidirectional transistor, and a super junction diode. Optionally, the multilayer structure of the Group III nitride semiconductor portion 3e may be changed as appropriate to form, as the second semiconductor element 120, an optical device such as a light-emitting diode, a semiconductor laser diode, or a solar cell. In that case, a driver circuit for a light-emitting device, a driver circuit for a semiconductor laser diode, or a power conditioner for a solar cell may be formed as an electronic circuit on the Group II-IV nitride semiconductor portion 4e.

Note that the first to fourth embodiments and their variations described above are only exemplary ones of various embodiments and their variations of the present disclosure and should not be construed as limiting. Rather, the exemplary embodiments and their variations may be readily modified in various manners depending on a design choice or any other factor without departing from the scope of the present disclosure.

For example, in the method for fabricating the nitride semiconductor structure 1 according to the first embodiment, the ZnGeN$_2$ crystal is grown to planarize a (001) plane of the ZnGeN$_2$ crystal. However, if a semiconductor element is going to be formed on a surface, other than the (001) plane, of the ZnGeN$_2$ crystal, then the (001) plane of the ZnGeN$_2$ crystal does not have to be planarized. In that case, a device structure just needs to be formed on a side surface of the ZnGeN$_2$ crystal.

Also, in the nitride semiconductor structure 1, the predetermined crystallographic plane may also be a (1-100) plane. In that case, in the Group II-IV nitride semiconductor portion 4, the crystal axis direction perpendicular to the predetermined crystallographic plane is preferably a [210] direction. This allows the nitride semiconductor structure 1 to reduce the chances of too many rotary domains being jumbled up in a confined region.

Furthermore, the nitride semiconductor device 10*d* may include, instead of the Group III nitride semiconductor substrate 2*c*, a substrate including: a single-crystalline silicon substrate; and a GaN layer formed on the single-crystalline silicon substrate. The GaN layer has a plurality of recesses, similar to the plurality of recesses 215, on one principal surface thereof opposite from the other principal surface thereof in contact with the single-crystalline silicon substrate.

(Recapitulation)

The embodiments and their variations described above may be specific implementations of the following aspects of the present disclosure.

A nitride semiconductor structure (1; 1*a*; 1*b*; 1*c*; 1*d*; 1*e*) according to a first aspect includes a Group III nitride semiconductor portion (3; 3*b*; 3*c*; 3*e*) and a Group II-IV nitride semiconductor portion (4; 4*a*; 4*b*; 4*c*; 4*d*; 4*e*). The Group III nitride semiconductor portion (3; 3*b*; 3*c*; 3*e*) is single crystalline. The Group III nitride semiconductor portion (3; 3*b*; 3*c*; 3*e*) contains a Group III element, where the Group III element is an element selected from the group 13 elements of the periodic table. The Group III nitride semiconductor portion (3; 3*b*; 3*c*; 3*e*) has a predetermined crystallographic plane (first side surface 33; principal surface 350; first surface 355; first side surface 33*e*). The Group II-IV nitride semiconductor portion (4; 4*a*; 4*b*; 4*c*; 4*d*; 4*e*) is provided on the predetermined crystallographic plane (first side surface 33; principal surface 350; first surface 355; first side surface 33*e*) of the Group III nitride semiconductor portion (3; 3*b*; 3*c*; 3*e*). The Group II-IV nitride semiconductor portion (4; 4*a*; 4*b*; 4*c*; 4*d*; 4*e*) is single crystalline. The Group II-IV nitride semiconductor portion (4; 4*a*; 4*b*; 4*c*; 4*d*; 4*e*) contains a Group II element and a Group IV element, where the Group II element is an element selected from either the group 2 elements of the periodic table or the group 12 elements of the periodic table and the Group IV element is an element selected from the group 14 elements of the periodic table. The Group II-IV nitride semiconductor portion (4; 4*a*; 4*b*; 4*c*; 4*d*; 4*e*) forms a heterojunction with the Group III nitride semiconductor portion (3; 3*b*; 3*c*; 3*e*). The predetermined crystallographic plane (first side surface 33; principal surface 350; first surface 355; first side surface 33*e*) is a crystallographic plane other than a (0001) plane.

The nitride semiconductor device (1; 1*a*; 1*b*; 1*c*; 1*d*; 1*e*) according to the first aspect achieves a configuration in which a single-crystalline Group II-IV nitride semiconductor portion (4; 4*a*; 4*b*; 4*c*; 4*d*; 4*e*) is provided over a single-crystalline Group III nitride semiconductor portion (3; 3*b*; 3*c*; 3*e*).

In a nitride semiconductor device (1; 1*a*; 1*b*; 1*c*; 1*d*; 1*e*) according to a second aspect, which may be implemented in conjunction with the first aspect, the Group II element is zinc. This allows the nitride semiconductor structure (1; 1*a*; 1*b*; 1*c*; 1*d*; 1*e*) according to the second aspect to contribute to lowering, when the conductivity type of at least a region of the Group II-IV nitride semiconductor portion (4; 4*a*; 4*b*; 4*c*; 4*d*; 4*e*) is defined to be p-type, the resistance of the p-type region.

In a nitride semiconductor structure (1; 1*a*; 1*b*; 1*c*; 1*d*; 1*e*) according to a third aspect, which may be implemented in conjunction with the first or second aspect, in the Group II-IV nitride semiconductor portion (4; 4*a*; 4*b*; 4*c*; 4*d*; 4*e*), a crystal axis direction perpendicular to the predetermined crystallographic plane (first side surface 33; principal surface 350; first surface 355; first side surface 33*e*) is a crystal axis direction other than a [001] direction. This allows the nitride semiconductor structure (1; 1*a*; 1*b*; 1*c*; 1*d*; 1*e*) according to the third aspect to reduce the number of rotary domains produced.

In a nitride semiconductor structure (1; 1*a*; 1*e*) according to a fourth aspect, which may be implemented in conjunction with any one of the first to third aspects, the predetermined crystallographic plane (first side surface 33; first side surface 33*e*) is a (11-20) plane. This allows the nitride semiconductor structure (1; 1*a*; 1*e*) according to the fourth aspect to reduce the number of rotary domains produced.

In a nitride semiconductor structure (1; 1*a*; 1*e*) according to a fifth aspect, which may be implemented in conjunction with the fourth aspect, in the Group II-IV nitride semiconductor portion (4; 4*a*; 4*e*), a crystal axis direction perpendicular to the predetermined crystallographic plane (first side surface 33; first side surface 33*e*) is a [010] direction. This allows the nitride semiconductor structure (1; 1*a*; 1*e*) according to the fifth aspect to minimize the energy of the interface between the Group III nitride semiconductor portion (3; 3*e*) and the Group II-IV nitride semiconductor portion (4; 4*a*; 4*e*), thus enabling defining the interfacial structure uniquely. As a result, this may reduce the chances of too many rotary domains being jumbled up in a confined region.

In a nitride semiconductor structure (1*b*; 1*c*; 1*d*) according to a sixth aspect, which may be implemented in conjunction with any one of the first to third aspects, the predetermined crystallographic plane (first principal surface 350; first surface 355) is a (11-22) plane. This allows the nitride semiconductor structure (1*b*; 1*c*; 1*d*) according to the sixth aspect to cover the predetermined crystallographic plane (first principal surface 350; first surface 355) with either a Group II element or Group IV element of the Group II-IV nitride semiconductor portion (4*b*; 4*c*; 4*d*) at an atomic layer level, thus reducing the chances of too many rotary domains being jumbled up in a confined region.

In a nitride semiconductor structure (1*b*; 1*c*; 1*d*) according to a seventh aspect, which may be implemented in conjunction with the sixth aspect, in the Group II-IV nitride semiconductor portion (4*b*; 4*c*; 4*d*), a crystal axis direction perpendicular to the predetermined crystallographic plane (first principal surface 350; first surface 355) is a [011] direction.

In a nitride semiconductor structure (1) according to an eighth aspect, which may be implemented in conjunction with any one of the first to third aspects, the predetermined crystallographic plane (first side surface 33) is a (1-100) plane. This allows the nitride semiconductor structure (1) according to the eighth aspect to reduce the chances of too many rotary domains being jumbled up in a confined region.

In a nitride semiconductor structure (1) according to a ninth aspect, which may be implemented in conjunction with the eighth aspect, in the Group II-IV nitride semiconductor portion (4), a crystal axis direction perpendicular to the predetermined crystallographic plane (first side surface 33) is a [210] direction. This allows the nitride semiconductor structure (1) according to the ninth aspect to reduce the chances of too many rotary domains being jumbled up in a confined region.

A nitride semiconductor device (10; 10d; 10e) according to a tenth aspect includes a semiconductor element (100; 100d; 100e) that includes at least a part of the Group II-IV nitride semiconductor portion (4; 4a; 4b; 4c; 4d; 4e) of the nitride semiconductor structure (1; 1a; 1b; 1c; 1d; 1e) according to any one of the first to ninth aspects. Thus, the nitride semiconductor device (10; 10d; 10e) according to the tenth aspect achieves a configuration in which a single-crystalline Group II-IV nitride semiconductor portion (4; 4a; 4b; 4c; 4d; 4e) is provided over a single-crystalline Group III nitride semiconductor portion (3; 3b; 3c; 3e).

In a nitride semiconductor device (10; 10d; 10e) according to an eleventh aspect, which may be implemented in conjunction with the tenth aspect, the Group II-IV nitride semiconductor portion (4; 4a; 4b; 4c; 4d; 4e) includes: an n-type semiconductor region (n-type $ZnGeN_2$ crystal 401, n-type $ZnGeSnN_2$ crystal 402, n-type $ZnGeN_2$ layer 411); and a p-type semiconductor region (p-type $ZnGeSnN_2$ crystal 404, p-type $ZnGeN_2$ crystal 405, p-type $ZnGeSnN_2$ layer 412). The semiconductor element (100; 100d; 100e) includes: at least a part of the n-type semiconductor region (n-type $ZnGeN_2$ crystal 401, n-type $ZnGeSnN_2$ crystal 402, n-type $ZnGeN_2$ layer 411); and at least a part of the p-type semiconductor region (p-type $ZnGeSnN_2$ crystal 404, p-type $ZnGeN_2$ crystal 405, p-type $ZnGeSnN_2$ layer 412).

A nitride semiconductor device (10e) according to a twelfth aspect, which may be implemented in conjunction with the tenth or eleventh aspect, further includes, separately from a first semiconductor element (100e) serving as the semiconductor element (100e), a second semiconductor element (120) formed on the Group III nitride semiconductor portion (3e).

In a nitride semiconductor device (10e) according to a thirteenth aspect, which may be implemented in conjunction with any one of the tenth to twelfth aspects, the Group III nitride semiconductor portion (3e) has a multilayer structure in which a plurality of Group III nitride semiconductor layers (first Group III nitride semiconductor layer 311, second Group III nitride semiconductor layer 312), having respectively different compositions, are stacked one on top of another.

A nitride semiconductor device (10; 10d; 10e) according to a fourteenth aspect, which may be implemented in conjunction with any one of the tenth to thirteenth aspects, further includes a single-crystalline silicon substrate (2). The Group III nitride semiconductor portion (3; 3e) is provided on the single-crystalline silicon substrate (2).

In a nitride semiconductor device (10) according to a fifteenth aspect, which may be implemented in conjunction with any one of the tenth to fourteenth aspects, the semiconductor element (100) formed on the Group II-IV nitride semiconductor portion (4a) is a light-emitting element that emits light.

A method for fabricating a nitride semiconductor device according to a sixteenth aspect is a method for fabricating the nitride semiconductor device (10; 10d; 10e) according to any one of the tenth to fifteenth aspects. The method includes epitaxially growing, on a predetermined crystallographic plane (first side surface 33; first principal surface; first surface 355; first side surface 33e) other than a (0001) plane of a single-crystalline Group III nitride semiconductor portion (3; 3b; 3c; 3e) containing a Group III element, a single-crystalline Group II-IV nitride semiconductor portion (4; 4a; 4b; 4c; 4d; 4e) containing a Group II element and a Group IV element, where the Group III element is an element selected from the group 13 elements of the periodic table, the Group II element is an element selected from either the group 2 elements of the periodic table or the group 12 elements of the periodic table, and the Group IV element is an element selected from the group 14 elements of the periodic table.

REFERENCE SIGNS LIST 1, 1a, 1b, 1c, 1d, 1e Nitride Semiconductor Structure
2 Single-Crystalline Silicon Substrate
3, 3b, 3c, 3d Group III Nitride Semiconductor Portion
33 First Side Surface (Predetermined Crystallographic Plane)
311 First Group III Nitride Semiconductor Layer
312 Second Group III Nitride Semiconductor Layer
350 Principal Surface (Predetermined Crystallographic Plane)
355 First Surface (Predetermined Crystallographic Plane)
4, 4a, 4b, 4c, 4d, 4e Group II-IV Nitride Semiconductor Portion
401 n-type $ZnGeN_2$ Crystal (n-type Semiconductor Region)
402 n-type $ZnGeSnN_2$ Crystal (n-type Semiconductor Region)
404 p-type $ZnGeSnN_2$ Crystal (p-type Semiconductor Region)
405 p-type $ZnGeN_2$ Crystal (p-type Semiconductor Region)
10, 10d, 10e Nitride Semiconductor Device
100, 100d, 100e Semiconductor Element (First Semiconductor Element)
120 Second Semiconductor Element

The invention claimed is:
1. A nitride semiconductor structure comprising:
a single-crystalline Group III nitride semiconductor portion containing a Group III element and having a predetermined crystallographic plane, where the Group III element is an element selected from the group 13 elements of the periodic table; and
a single-crystalline Group II-IV nitride semiconductor portion provided on the predetermined crystallographic plane of the Group III nitride semiconductor portion, the Group II-IV nitride semiconductor portion containing a Group II element and a Group IV element, the Group II-IV nitride semiconductor portion forming a heterojunction with the Group III nitride semiconductor portion, where the Group II element is an element selected from either the group 2 elements of the periodic table or the group 12 elements of the periodic table and the Group IV element is an element selected from the group 14 elements of the periodic table,
the predetermined crystallographic plane is a crystallographic plane other than a (0001) plane.
2. The nitride semiconductor structure of claim 1, wherein the Group II element is zinc.
3. The nitride semiconductor structure of claim 1, wherein in the Group II-IV nitride semiconductor portion, a crystal axis direction perpendicular to the predetermined crystallographic plane is a crystal axis direction other than a [001] direction.
4. The nitride semiconductor structure of claim 1, wherein the predetermined crystallographic plane is a (11-20) plane.

5. The nitride semiconductor structure of claim 4, wherein in the Group II-IV nitride semiconductor portion, a crystal axis direction perpendicular to the predetermined crystallographic plane is a [010] direction.

6. The nitride semiconductor structure of claim 1, wherein the predetermined crystallographic plane is a (11-22) plane.

7. The nitride semiconductor structure of claim 6, wherein in the Group II-IV nitride semiconductor portion, a crystal axis direction perpendicular to the predetermined crystallographic plane is a [011] direction.

8. The nitride semiconductor structure of claim 1, wherein the predetermined crystallographic plane is a (1-100) plane.

9. The nitride semiconductor structure of claim 8, wherein in the Group II-IV nitride semiconductor portion, a crystal axis direction perpendicular to the predetermined crystallographic plane is a [210] direction.

10. A nitride semiconductor device comprising a semiconductor element that includes at least a part of the Group II-IV nitride semiconductor portion of the nitride semiconductor structure according to of claim 1.

11. The nitride semiconductor device of claim 10, wherein the Group II-IV nitride semiconductor portion includes:
an n-type semiconductor region; and
a p-type semiconductor region, and
the semiconductor element includes:
at least a part of the n-type semiconductor region; and
at least a part of the p-type semiconductor region.

12. The nitride semiconductor device of claim 10, further comprising, separately from a first semiconductor element serving as the semiconductor element, a second semiconductor element formed on the Group III nitride semiconductor portion.

13. The nitride semiconductor device of claim 10, wherein
the Group III nitride semiconductor portion has a multilayer structure in which a plurality of Group III nitride semiconductor layers, having respectively different compositions, are stacked one on top of another.

14. The nitride semiconductor device of claim 10, further comprising a single-crystalline silicon substrate, wherein
the Group III nitride semiconductor portion is provided on the single-crystalline silicon substrate.

15. The nitride semiconductor device of claim 10, wherein
the semiconductor element formed on the Group II-IV nitride semiconductor portion is a light-emitting element that emits light.

16. A method for fabricating the nitride semiconductor device of claim 10, the method comprising:
epitaxially growing, on a predetermined crystallographic plane other than a (0001) plane of a single-crystalline Group III nitride semiconductor portion containing a Group III element, a Group II-IV nitride semiconductor portion containing a Group II element and a Group IV element, where the Group III element is an element selected from the group 13 elements of the periodic table, the Group II element is an element selected from either the group 2 elements of the periodic table or the group 12 elements of the periodic table, and the Group IV element is an element selected from the group 14 elements of the periodic table.

* * * * *